US012677690B2

(12) United States Patent
Guevara

(10) Patent No.: US 12,677,690 B2
(45) Date of Patent: Jul. 7, 2026

(54) SEMICONDUCTOR PACKAGE HAVING A CONDUCTIVE MEMBER WITH A METAL CORE FOR SUBSTRATE CONNECTIONS

(71) Applicant: TEXAS INSTRUMENTS INCORPORATED, Dallas, TX (US)

(72) Inventor: Rafael Jose Lizares Guevara, Angeles (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 609 days.

(21) Appl. No.: 18/150,510

(22) Filed: Jan. 5, 2023

(65) Prior Publication Data

US 2024/0234356 A1 Jul. 11, 2024

(51) Int. Cl.
| | |
|---|---|
| *H10W 72/90* | (2026.01) |
| *H10W 72/00* | (2026.01) |
| *H10W 72/20* | (2026.01) |
| *H10W 72/29* | (2026.01) |
| *H10W 74/01* | (2026.01) |
| *H10W 74/10* | (2026.01) |

(52) U.S. Cl.
CPC ........... *H10W 72/90* (2026.01); *H10W 74/01* (2026.01); *H10W 74/111* (2026.01); *H10W 72/07236* (2026.01); *H10W 72/222* (2026.01); *H10W 72/232* (2026.01); *H10W 72/242* (2026.01); *H10W 72/252* (2026.01); *H10W 72/29* (2026.01)

(58) Field of Classification Search
CPC ......... H01L 24/13; H01L 24/05; H01L 24/81; H01L 21/56; H01L 23/3107; H01L 2224/0401; H01L 2224/13014; H01L 2224/13023; H01L 2224/13083; H01L 2224/13147; H01L 2224/13155; H01L 2224/81815; H01L 2924/014
See application file for complete search history.

(56) References Cited

U.S. PATENT DOCUMENTS

| | | | | |
|---|---|---|---|---|
| 5,821,494 A | * | 10/1998 | Albrecht .............. | G11B 5/4853 228/111.5 |
| 6,186,392 B1 | * | 2/2001 | Ball ................... | B23K 35/0244 228/245 |

(Continued)

FOREIGN PATENT DOCUMENTS

| | | | | |
|---|---|---|---|---|
| KR | 20180043629 | * | 4/2018 | ........... B23K 1/0016 |

OTHER PUBLICATIONS

Texas Instruments Incorporated, "Conductive Terminal For Side Facing Packages," U.S. Appl. No. 17/677,624, filed Feb. 22, 2022, 23 p.

*Primary Examiner* — Wael M Fahmy
*Assistant Examiner* — Tiberiu Dan Onuta
(74) *Attorney, Agent, or Firm* — Dawn Jos; Frank D. Cimino

(57) ABSTRACT

In examples, a semiconductor package comprises a semiconductor die including a circuit, a housing covering the semiconductor die, and a conductive terminal coupled to the semiconductor die and exposed to an exterior surface of the housing. The package also comprises a sensor exposed on the exterior surface of the housing, a flux layer on the conductive terminal and a conductive member on the flux layer. The conductive member includes a copper core, a nickel layer covering the copper core, and a solder layer covering the nickel layer.

19 Claims, 22 Drawing Sheets

(56) References Cited

U.S. PATENT DOCUMENTS

| | | | | |
|---|---|---|---|---|
| 7,718,523 | B1 * | 5/2010 | Yoo | H01L 24/11 |
| | | | | 257/737 |
| 11,646,285 | B2 * | 5/2023 | Son | H10W 72/072 |
| | | | | 257/738 |
| 2004/0067603 | A1 * | 4/2004 | Hagen | G01L 19/141 |
| | | | | 438/126 |
| 2022/0059423 | A1 * | 2/2022 | Manack | H10W 74/124 |
| 2022/0367334 | A1 * | 11/2022 | Huang | H01L 21/4857 |

* cited by examiner

104

302

304

300

104

302 304

3A

3A

300

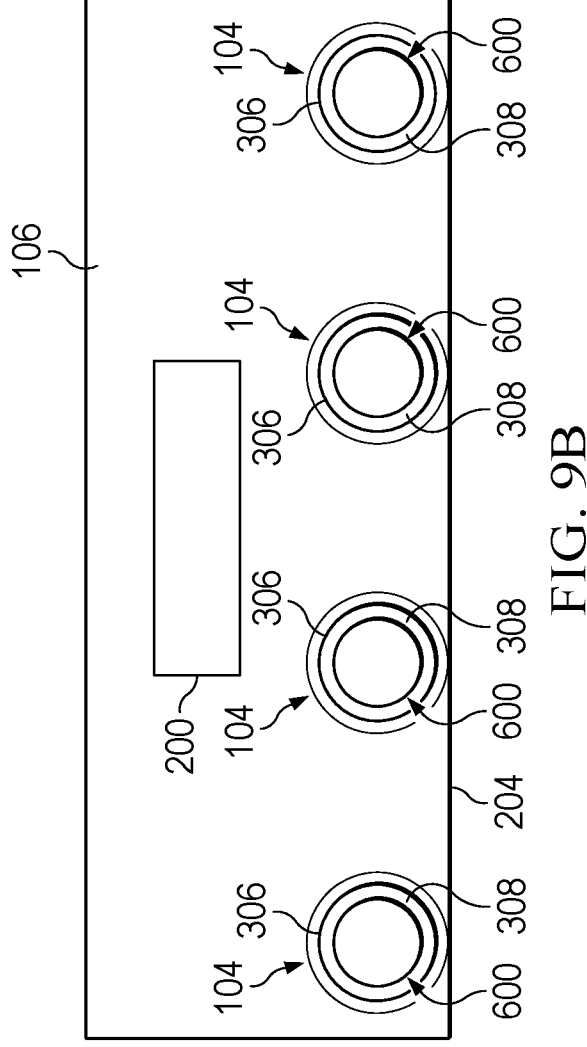
FIG. 9B

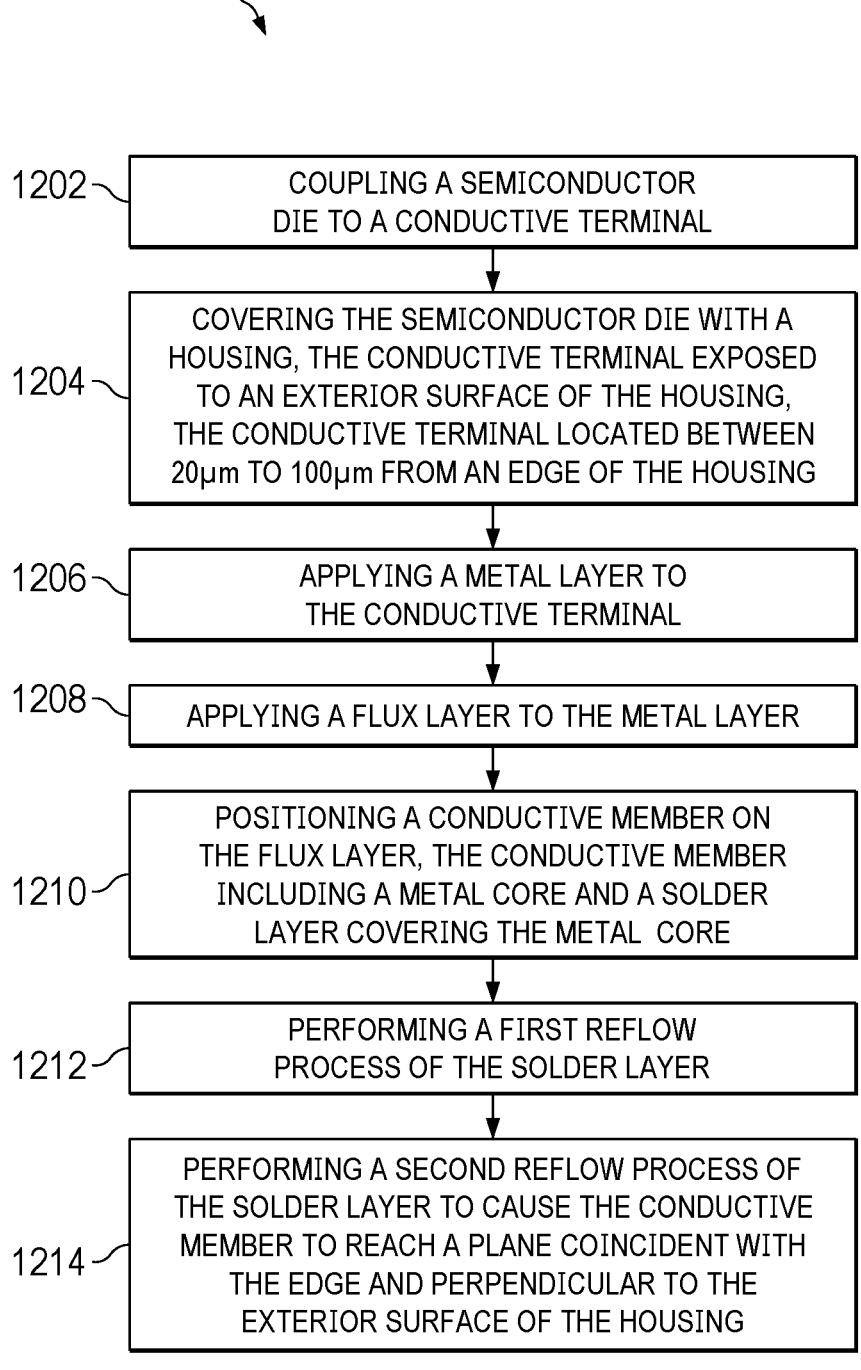

1200

1202 — COUPLING A SEMICONDUCTOR
DIE TO A CONDUCTIVE TERMINAL

1204 — COVERING THE SEMICONDUCTOR DIE WITH A
HOUSING, THE CONDUCTIVE TERMINAL EXPOSED
TO AN EXTERIOR SURFACE OF THE HOUSING,
THE CONDUCTIVE TERMINAL LOCATED BETWEEN
20μm TO 100μm FROM AN EDGE OF THE HOUSING

1206 — APPLYING A METAL LAYER TO
THE CONDUCTIVE TERMINAL

1208 — APPLYING A FLUX LAYER TO THE METAL LAYER

1210 — POSITIONING A CONDUCTIVE MEMBER ON
THE FLUX LAYER, THE CONDUCTIVE MEMBER
INCLUDING A METAL CORE AND A SOLDER
LAYER COVERING THE METAL CORE

1212 — PERFORMING A FIRST REFLOW
PROCESS OF THE SOLDER LAYER

1214 — PERFORMING A SECOND REFLOW PROCESS OF
THE SOLDER LAYER TO CAUSE THE CONDUCTIVE
MEMBER TO REACH A PLANE COINCIDENT WITH
THE EDGE AND PERPENDICULAR TO THE
EXTERIOR SURFACE OF THE HOUSING

FIG. 12

SEMICONDUCTOR PACKAGE HAVING A CONDUCTIVE MEMBER WITH A METAL CORE FOR SUBSTRATE CONNECTIONS

BACKGROUND

A semiconductor package may include a semiconductor die and a housing to cover the semiconductor die. The package may further include conductive terminals exposed to an exterior surface of the housing. The conductive terminals are coupled to the semiconductor die. The conductive terminals provide electrical pathways between circuitry on the semiconductor die and components (e.g., printed circuit boards) outside of the package.

SUMMARY

In examples, a semiconductor package comprises a semiconductor die including a circuit, a housing covering the semiconductor die, and a conductive terminal coupled to the semiconductor die and exposed to an exterior surface of the housing. The package also comprises a sensor exposed on the exterior surface of the housing, a flux layer on the conductive terminal and a conductive member on the flux layer. The conductive member includes a copper core, a nickel layer covering the copper core, and a solder layer covering the nickel layer.

In examples, a method for manufacturing a semiconductor package comprises coupling a semiconductor die to a conductive terminal; covering the semiconductor die with a housing, the conductive terminal and a sensor exposed to an exterior surface of the housing; and applying a metal layer to the conductive terminal. The method also comprises applying a flux layer to the metal layer and positioning a conductive member on the flux layer, the conductive member including a metal core and a solder layer covering the metal core. The method also comprises performing a first reflow process of the solder layer. The solder layer has a volume such that, upon a second reflow of the solder layer, the conductive member is able to reach a plane coincident with an edge of the exterior surface and perpendicular to the exterior surface of the housing.

BRIEF DESCRIPTION OF THE DRAWINGS

FIG. 9B is a frontal view of a semiconductor package coupled to a conductive member with a metal core to facilitate substrate connections, in accordance with various examples.

FIG. 12 is a flow diagram of a method for manufacturing a semiconductor package and coupling the package to a substrate by way of a conductive member with a metal core, in accordance with various examples.

DETAILED DESCRIPTION

Many semiconductor packages include conductive terminals that are positioned for easy coupling to a substrate, such as a printed circuit board (PCB). But in some semiconductor packages, including sensor applications, the conductive terminals are on a side exterior surface of the package that extends vertically from the PCB. These conductive terminals are located several millimeters above the PCB. The conductive terminals are coupled to the PCB using a solder reflow process. Specifically, solder that is placed on the conductive terminals is reflowed, causing the solder to flow toward the PCB due to gravity. In this way, a solder connection is formed between the conductive terminals and the PCB. But in many cases, the solder fails to reach the PCB and form a proper connection. Further, the steps used to form the conductive terminals to which the solder couples are time-consuming and expensive.

This disclosure describes various examples of a semiconductor package having a conductive member with a metal core to facilitate connections between conductive terminals of the package and a substrate on which the package is mounted. In examples, the semiconductor package includes a semiconductor die including a circuit and a housing covering the semiconductor die. The package also includes a conductive terminal coupled to the semiconductor die and exposed to an exterior surface of the housing, the conductive terminal located between 20 microns and 100 microns from an edge of the housing. The package also includes a flux layer on the conductive terminal and a conductive member on the flux layer. The conductive member includes a metal core and a solder layer covering the metal core. The conductive member has a volume ranging from 14 kilomicrons$^3$ to 524 kilomicrons$^3$, and the solder layer has a volume that is a percentage of the metal core volume ranging from 40% to 80%. The weight and shape of the metal core encourages solder flow toward a substrate to which the package is coupled. The surface area of the core also facilitates the use of larger amounts of solder than would otherwise be possible, thus further encouraging solder flow and the formation of strong, reliable connections between conductive terminals and the substrate to which the package is mounted. Because a metal (e.g., copper) core is used, metal (e.g., copper) layers that would otherwise have been included as part of the conductive terminals may be omitted, thus significantly reducing manufacturing time and expense.

Figure 1:
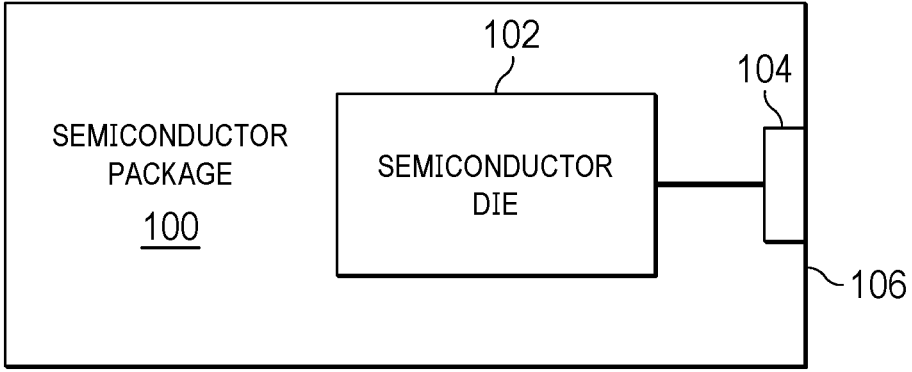
FIG. 1 is a block diagram of a semiconductor package configured to couple to a conductive member with a metal core for substrate connections, in accordance with various examples.

FIG. 1 is a block diagram of a semiconductor package configured to couple to a conductive member with a metal core for substrate connections, in accordance with various examples. Specifically, FIG. 1 shows a semiconductor package 100 including a semiconductor die 102 and a conductive terminal 104 coupled to the semiconductor die 102. The conductive terminal 104 is exposed to a lateral exterior surface 106 of the semiconductor package 100. As described below, a spherical or ovoid conductive member having a metal (e.g., copper) core, a protective (e.g., nickel) layer covering the metal core, and a solder layer covering the protective layer and the metal core may be coupled to the conductive terminal 104 and then reflowed to couple the conductive terminal 104 to a metal trace on a PCB.

Figure 2A:
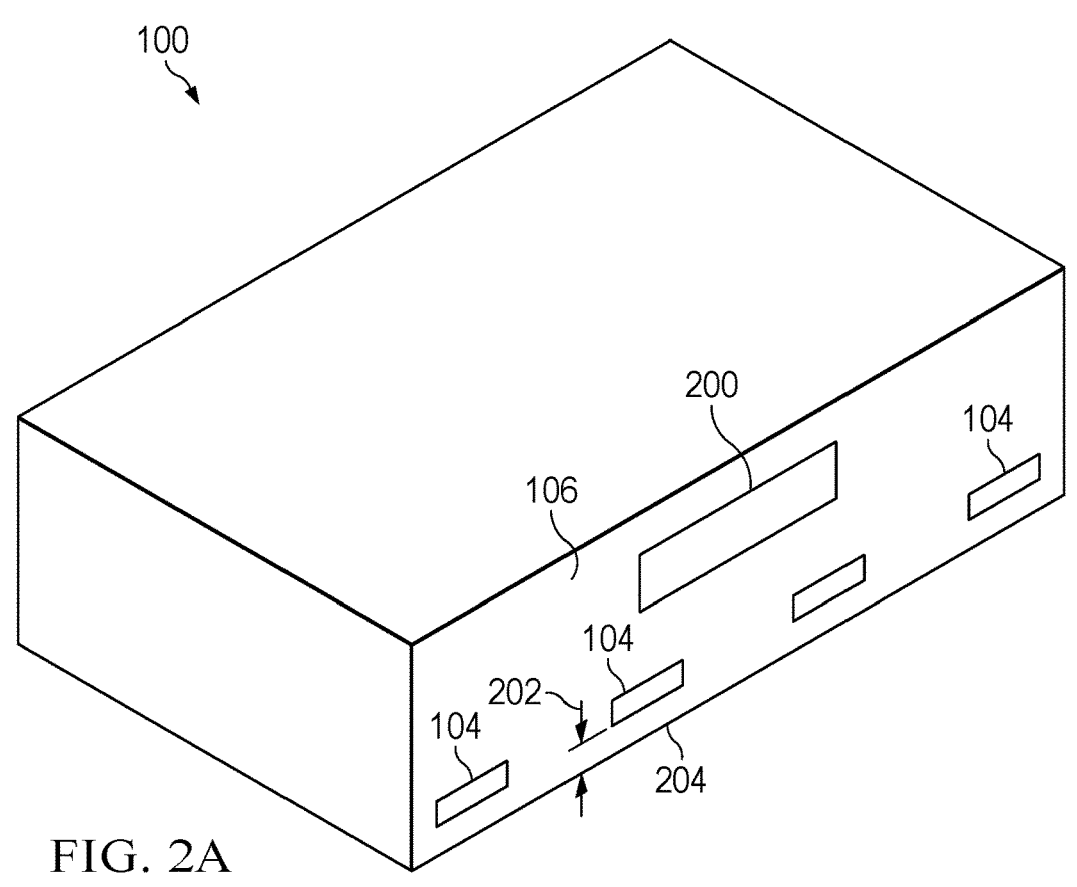
FIG. 2A is a perspective view of a semiconductor package configured to couple to a conductive member with a metal core for substrate connections, in accordance with various examples.
Figure 2B:
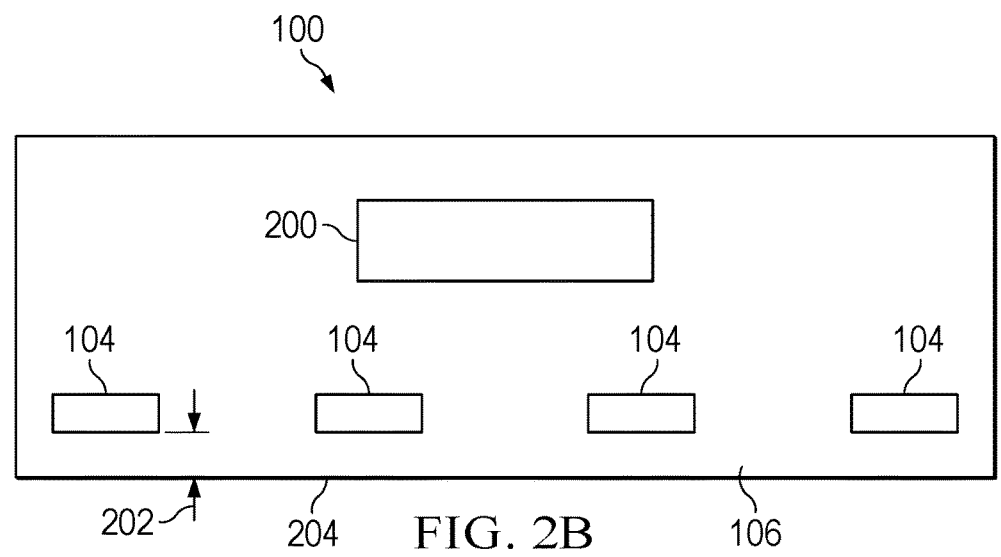
FIG. 2B is a frontal view of a semiconductor package configured to couple to a conductive member with a metal core for substrate connections, in accordance with various examples.

FIG. 2A is a perspective view of a semiconductor package, in accordance with various examples. Specifically, FIG. 2A shows the semiconductor package 100 having multiple conductive terminals 104 on the surface 106. The semiconductor package 100 may also include a photo sensor 200, for example, in case the semiconductor package 100 is a sensor package in a light sensing application. A distance 202 between each conductive terminal 104 and the closest point on the bottom edge 204 of the surface 106 ranges between 20 microns and 100 microns, with a distance greater than this range being disadvantageous because the solder volume of the conductive member will collapse and fail to form a proper connection between the conductive terminal 104 and a PCB, and with a distance lesser than this range causing a disadvantageous displacement of the metal core of the conductive member. FIG. 2B is a frontal view of the semiconductor package 100 of FIG. 2A, in accordance with various examples.

Figure 3A:
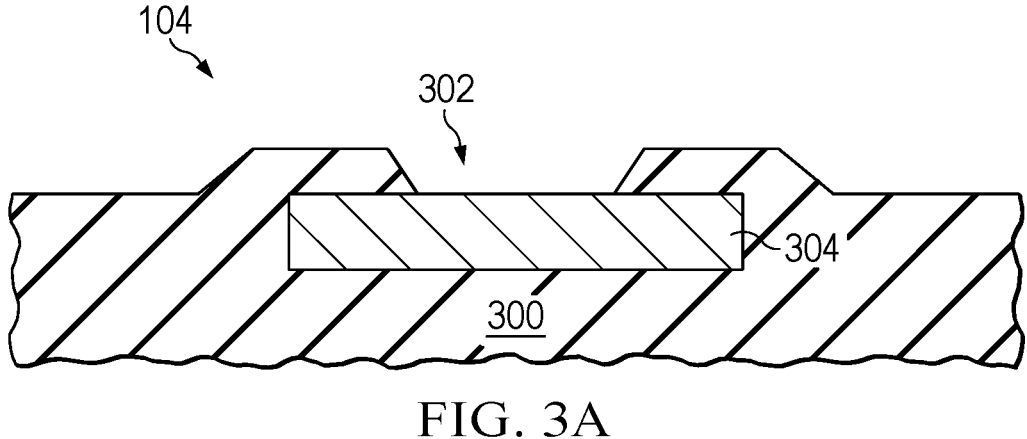
FIG. 3A is a cross-sectional profile view of a semiconductor package conductive terminal configured to couple to a conductive member with a metal core to facilitate substrate connections, in accordance with various examples.
Figure 3B:
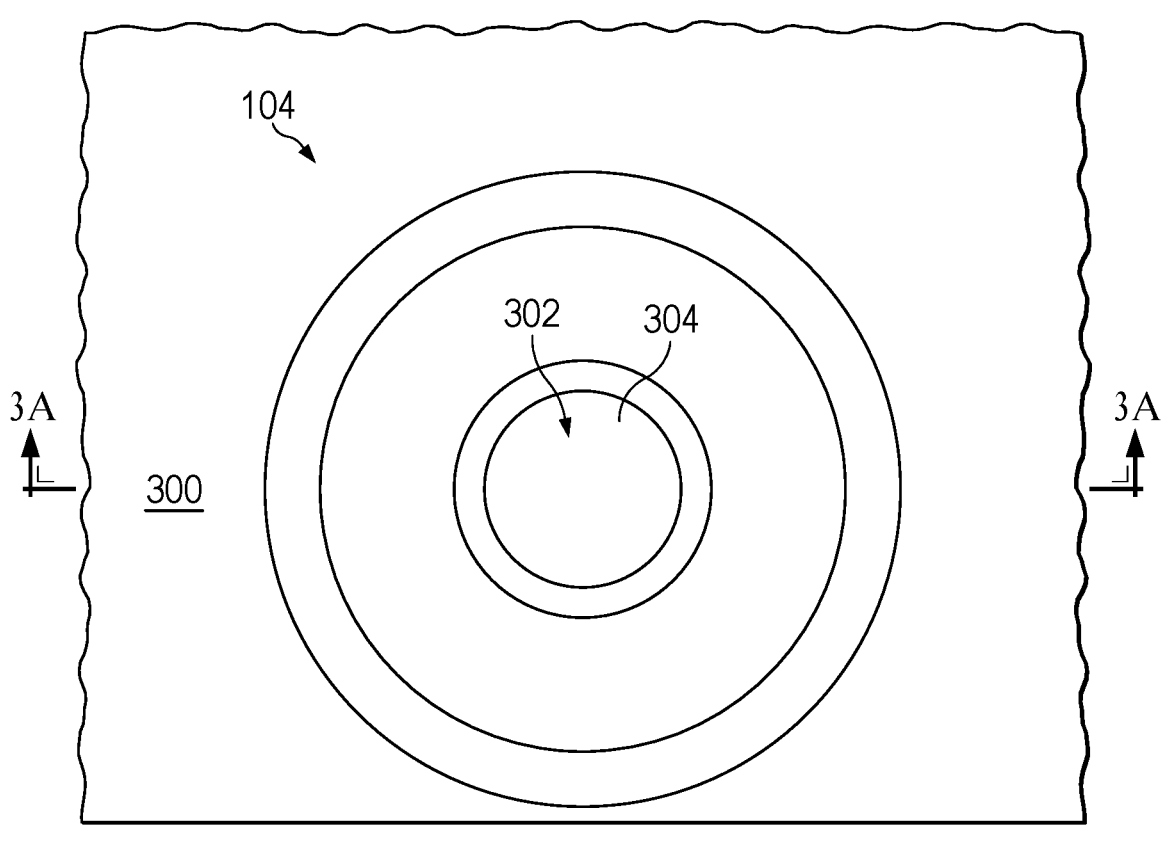
FIG. 3B is a top-down view of a semiconductor package conductive terminal configured to couple to a conductive member with a metal core to facilitate substrate connections, in accordance with various examples.
Figure 3C:
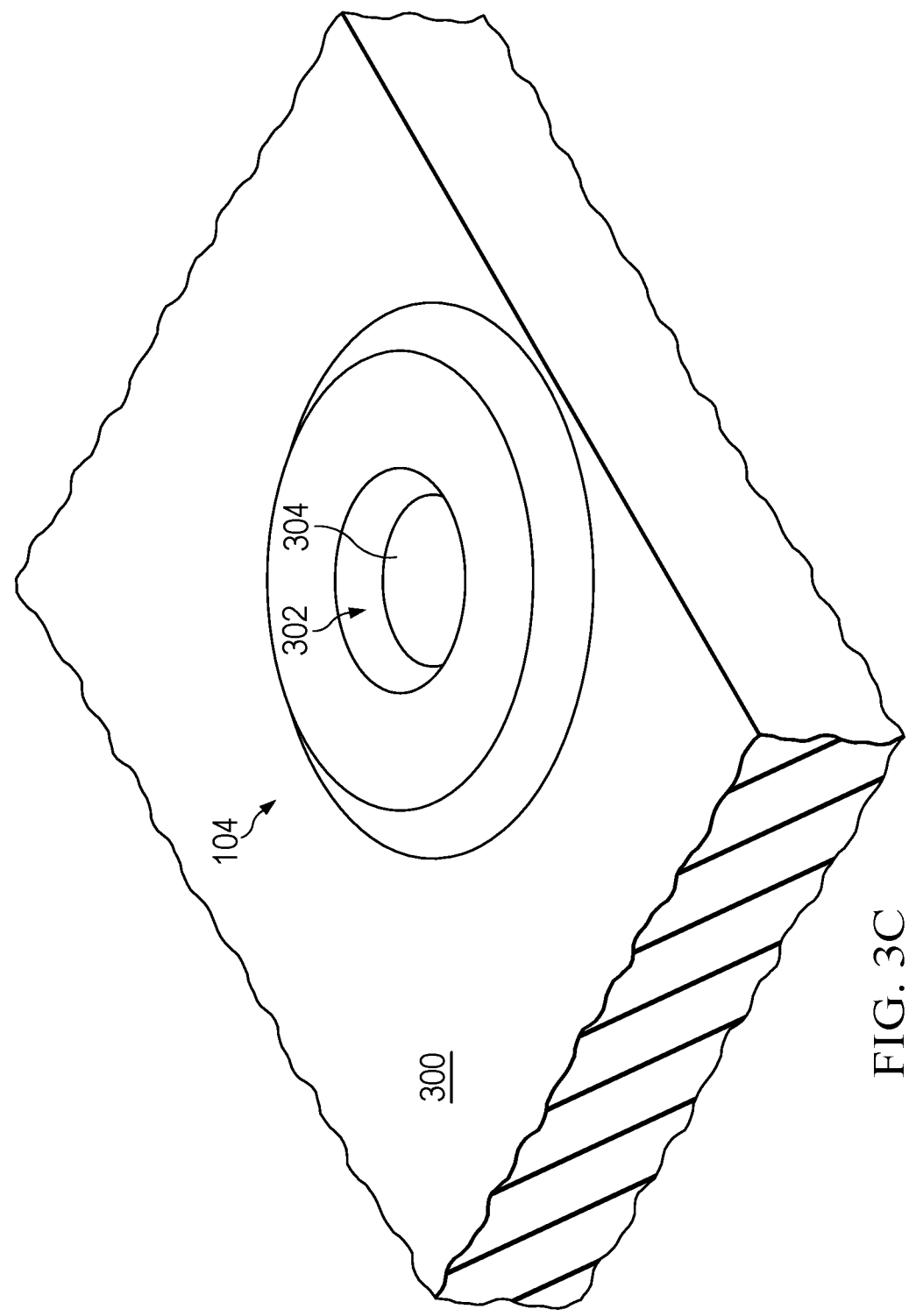
FIG. 3C is a perspective view of a semiconductor package conductive terminal configured to couple to a conductive member with a metal core to facilitate substrate connections, in accordance with various examples.

FIG. 3A is a cross-sectional profile view of the semiconductor package conductive terminal 104 configured to couple to a conductive member with a metal core to facilitate substrate connections, in accordance with various examples. The detailed features shown in FIG. 3A are not expressly shown in FIGS. 1, 2A, and 2B. The conductive terminal 104 includes a protective layer 300 (e.g., a polyimide layer). The protective layer 300 has been patterned using a photolithography process (e.g., using suitable masks, exposures, bakes, developers, etc.) to produce an opening 302 in the protective layer 300. A metal layer 304 (e.g., a bond pad) is exposed and accessible through the opening 302. In examples, the metal layer 304 is aluminum, copper, gold, or any other suitable metal or alloy. FIG. 3B is a top-down view of the structure of FIG. 3A. FIG. 3C is a perspective view of the structure of FIG. 3A.

Figure 4A:
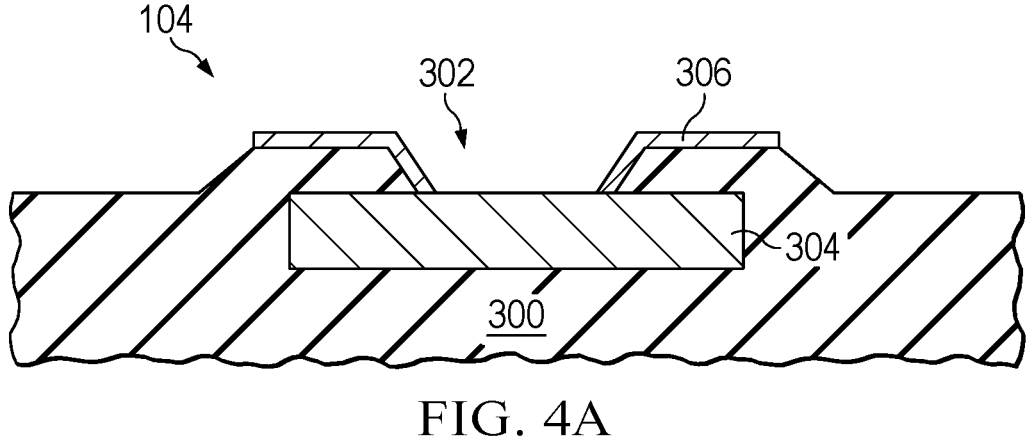
FIG. 4A is a cross-sectional profile view of a semiconductor package conductive terminal configured to couple to a conductive member with a metal core to facilitate substrate connections, in accordance with various examples.

FIG. 4A is a cross-sectional profile view of the semiconductor package conductive terminal 104, in accordance with various examples. The conductive terminal 104 as shown in FIG. 4A is identical to that shown in FIG. 3A, but with the addition of a metal seed layer 306 on the protective layer 300 and on the metal layer 304. The metal seed layer 306 may be applied using any suitable technique, including sputtering. As described below, a conductive member (e.g., a relatively large, spherical or ovoid conductive member) may later be positioned above the metal seed layer 306, and the metal seed layer 306 provides a broad surface area to adequately couple to the conductive member to transfer electrical signals between the conductive member and the metal layer 304. To achieve such electrical communication, the metal seed layer 306 may have a thickness ranging from 1 kiloAngstrom to 4 kiloAngstroms, with a thickness outside this range being disadvantageous because of deleterious effects on resistivity and/or drain-source on resistance (RD-SON) performance.

Figure 4B:
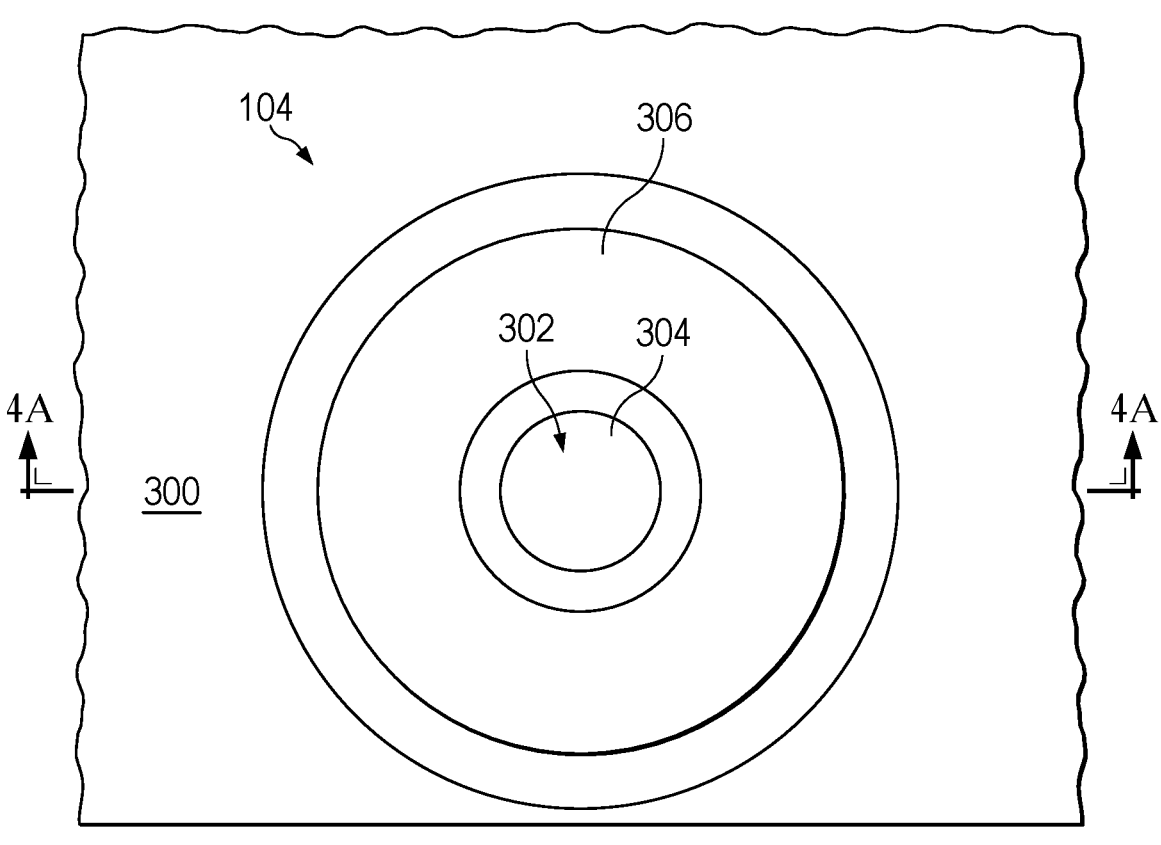
FIG. 4B is a top-down view of a semiconductor package conductive terminal configured to couple to a conductive member with a metal core to facilitate substrate connections, in accordance with various examples.
Figure 4C:
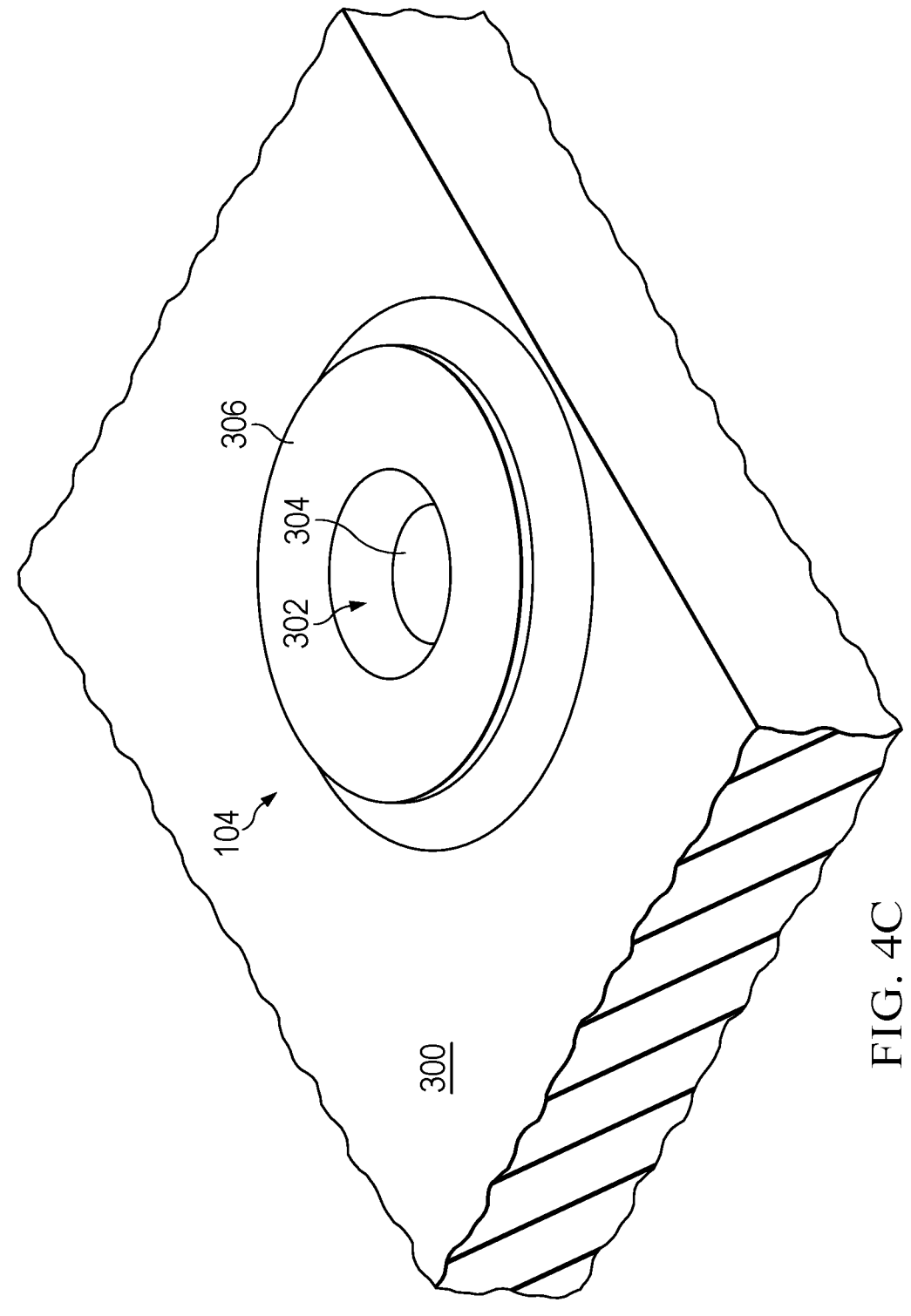
FIG. 4C is a perspective view of a semiconductor package conductive terminal configured to couple to a conductive member with a metal core to facilitate substrate connections, in accordance with various examples.

FIG. 4B is a top-down view of the semiconductor package conductive terminal 104 of FIG. 4A, in accordance with various examples. FIG. 4C is a perspective view of the semiconductor package conductive terminal 104, in accordance with various examples.

Figure 5A:
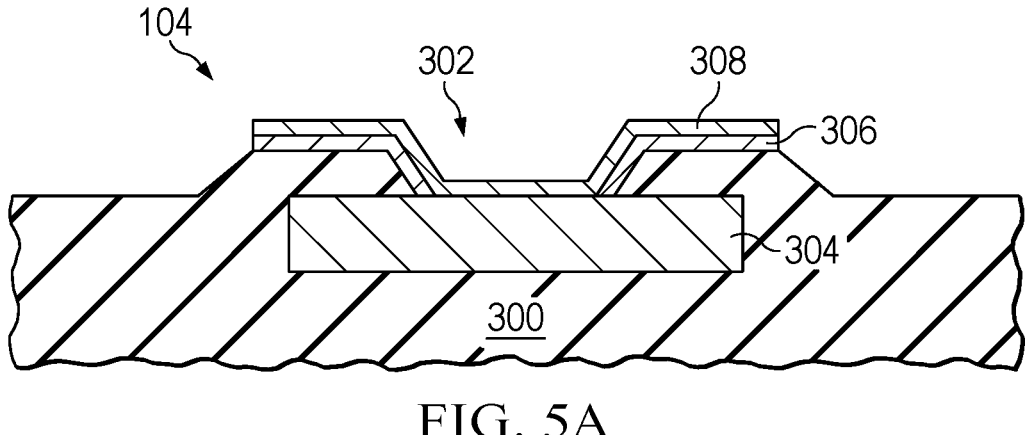
FIG. 5A is a cross-sectional profile view of a semiconductor package conductive terminal configured to couple to a conductive member with a metal core to facilitate substrate connections, in accordance with various examples.

FIG. 5A is a cross-sectional profile view of the semiconductor package conductive terminal 104 of FIG. 4A, but with the addition of a flux layer 308 above and abutting the seed layer 306. The flux layer 308 is conductive and may be composed of organic adhesives. The flux layer 308 serves as an adhesive between the conductive member (which is described below) and the metal layer 304, and the flux layer 308 further serves to activate the solder in the conductive member upon a reflow (e.g., heating) process. The flux layer 308 has a thickness ranging from 20 microns to 40 microns, with a greater thickness being disadvantageous because the flux will smear across different metal contacts due to the increased flux volume, and with a lesser thickness being disadvantageous because the flux will be unable to activate the solder in the conductive member. The flux layer 308 has an area that is 120%-180% of the area of the opening in the protective layer 300 to expose the metal layer 304. The flux layer 308 may be applied by screen printing using stencils. After the flux layer 308 is applied to the metal seed layer 306, the flux layer 308 may be heated to a temperature ranging from 220 degrees Celsius to 250 degrees Celsius for a liquidus time ranging from 30 seconds to 60 seconds, thereby causing the flux layer 308 to adhere to the underlying metal seed layer 306. Heat application outside of these ranges will result in damage to the flux layer 308 and/or a flux layer 308 that is ineffective to maintain the conductive member in position, as described in more detail below.

Figure 5B:
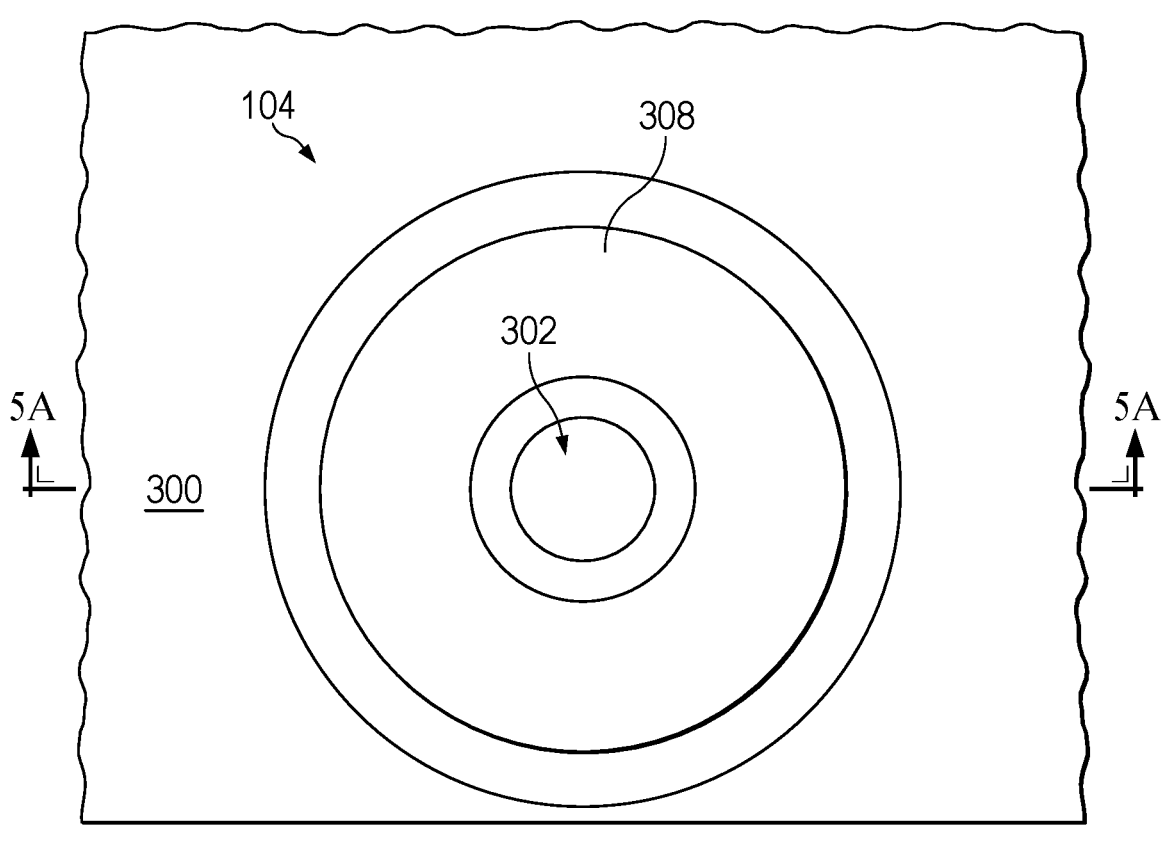
FIG. 5B is a top-down view of a semiconductor package conductive terminal configured to couple to a conductive member with a metal core to facilitate substrate connections, in accordance with various examples.
Figure 5C:
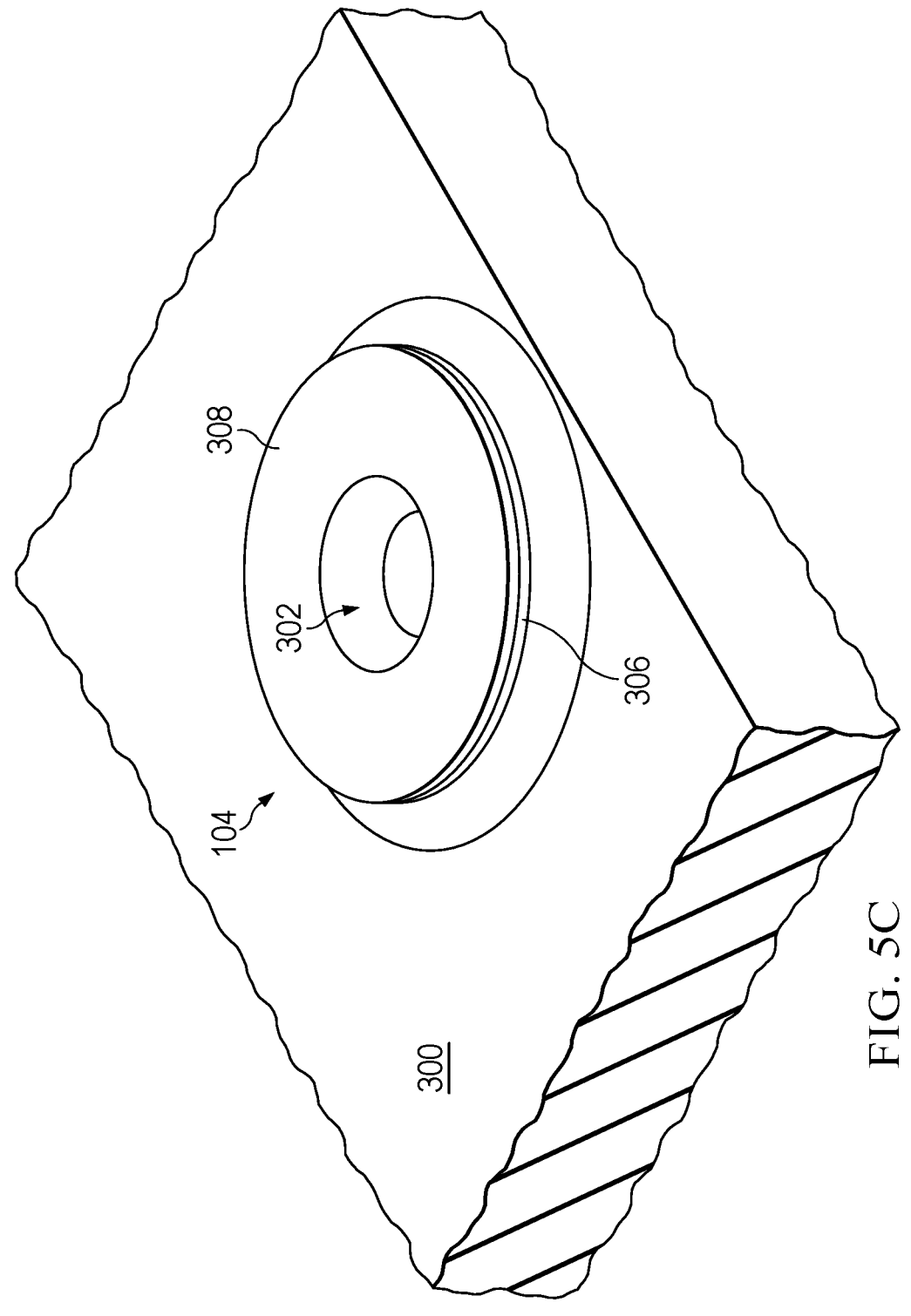
FIG. 5C is a perspective view of a semiconductor package conductive terminal configured to couple to a conductive member with a metal core to facilitate substrate connections, in accordance with various examples.

FIG. 5B is a top-down view of the semiconductor package conductive terminal 104 of FIG. 5A, in accordance with various examples. FIG. 5C is a perspective view of the semiconductor package conductive terminal 104 of FIG. 5A, in accordance with various examples.

Figure 6A:
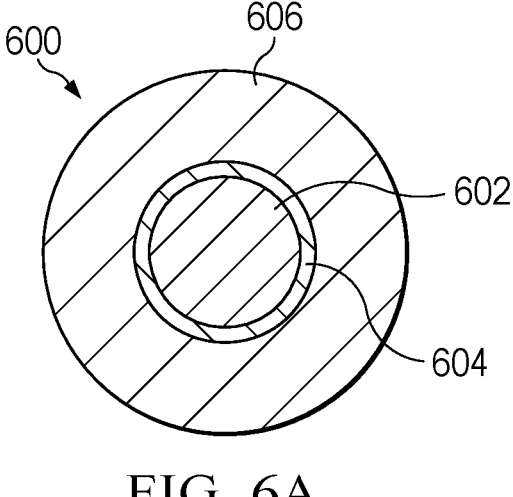
FIG. 6A is a cross-sectional view of a conductive member with a metal core to facilitate substrate connections, in accordance with various examples.
Figure 6B:
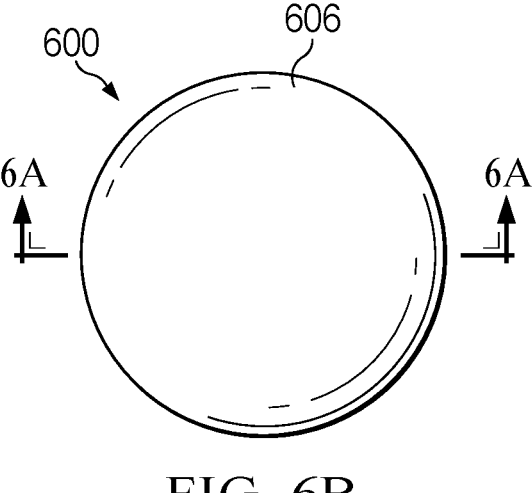
FIG. 6B is a perspective view of a conductive member with a metal core to facilitate substrate connections, in accordance with various examples.

FIG. 6A is a cross-sectional view of a conductive member with a metal core to facilitate substrate connections, in accordance with various examples. Specifically, FIG. 6A shows a conductive member 600 that may be coupled to the semiconductor package conductive terminal 104 described above. The conductive member 600 may have a spherical or ovoid shape, although other shapes are contemplated and included in the scope of this disclosure. The conductive member 600 may include a metal core 602 (e.g., copper). The conductive member 600 may include a protective layer 604 (e.g., nickel) covering the metal core 602. The protective layer 604 may prevent oxidation of the metal core 602, should the metal core 602 be exposed to ambient air or other deleterious influences. In some examples, the protective layer 604 is omitted. The conductive member 600 may include a solder layer 606 covering the metal core 602. FIG. 6B is a perspective view of the conductive member 600, in accordance with various examples.

As described below, the conductive member 600 is applied to the flux layer 308 (FIG. 5A) and a reflow process is performed to cause the flux layer 308 to activate the solder layer 606. The flux layer 308 adheres to the solder layer 606, thus holding the conductive member 600 in place. The flux layer 308 holds the conductive member 600 in place even if the semiconductor package 100 were moved, turned upside down, shaken, etc. Later, the semiconductor package 100 may be positioned on a PCB and another reflow process performed. This reflow process dislodges the conductive member 600, causing the solder layer 606 to flow with gravity toward a metal trace on the PCB. The volume of solder in the solder layer 606 is adequate to encourage contact with both the conductive terminal 104 and the metal trace on the PCB. Similarly, the weight and/or mass of the metal core 602 is adequate to encourage flow of the solder layer 606 and to establish contact with both the conductive terminal 104 and the metal trace on the PCB. Such a reflow process is now described in more detail with reference to FIGS. 7A-11C.

Figure 7A:
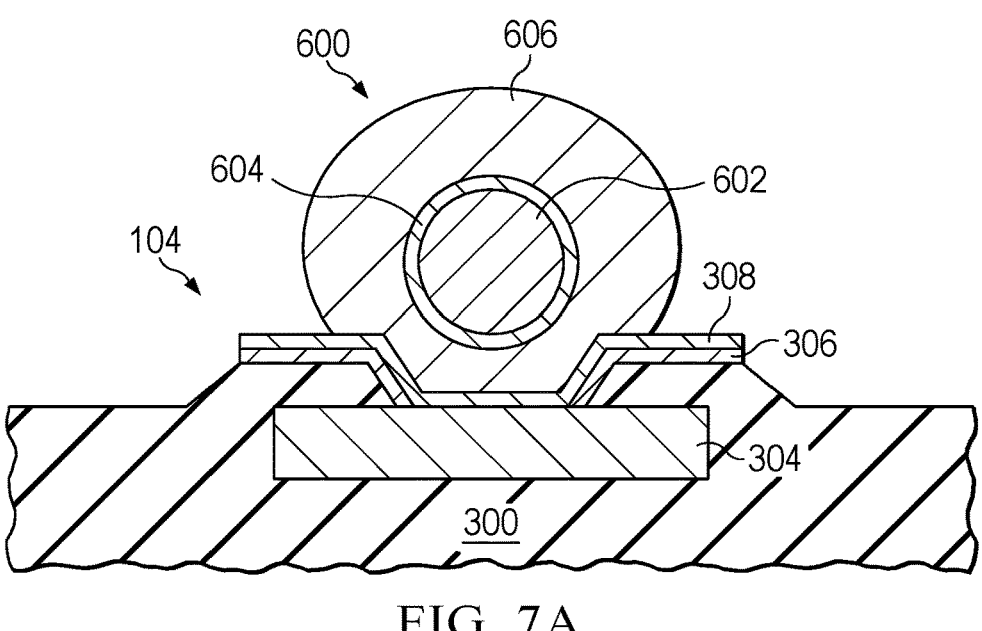
FIG. 7A is a cross-sectional profile view of a semiconductor package conductive terminal coupled to a conductive member with a metal core to facilitate substrate connections, in accordance with various examples.
Figure 7B:
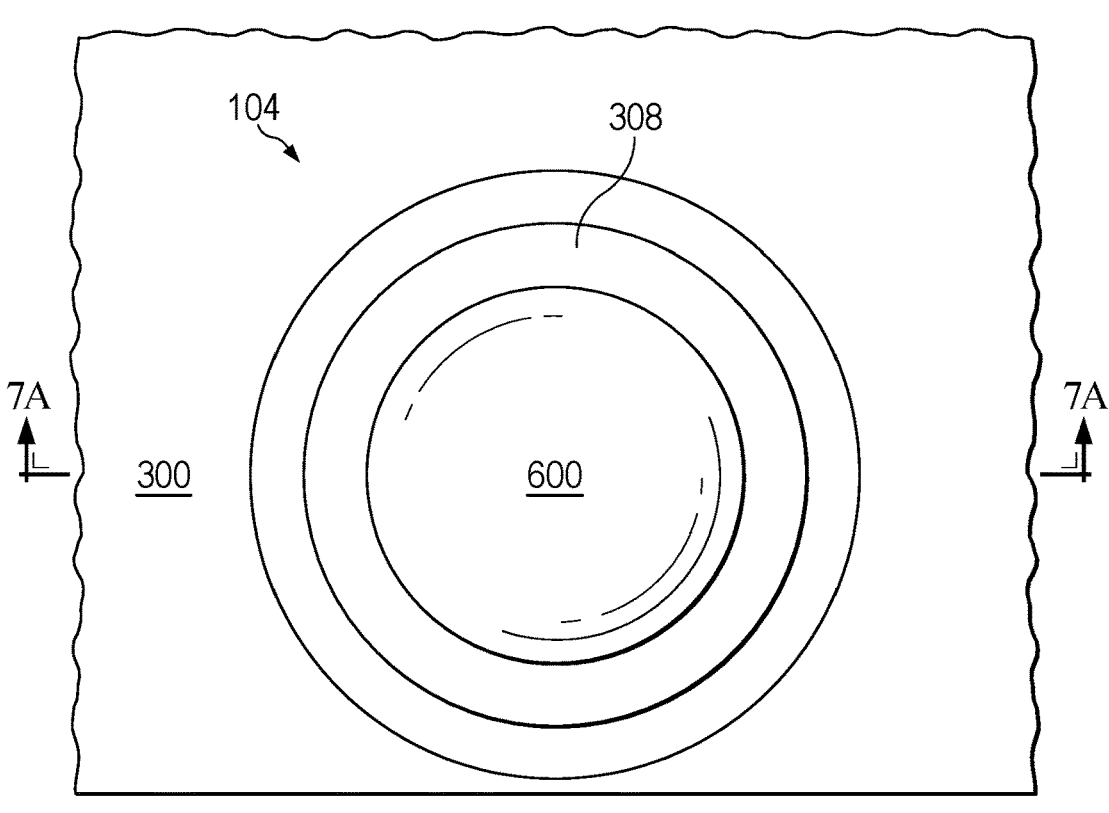
FIG. 7B is a top-down view of a semiconductor package conductive terminal coupled to a conductive member with a metal core to facilitate substrate connections, in accordance with various examples.
Figure 7C:
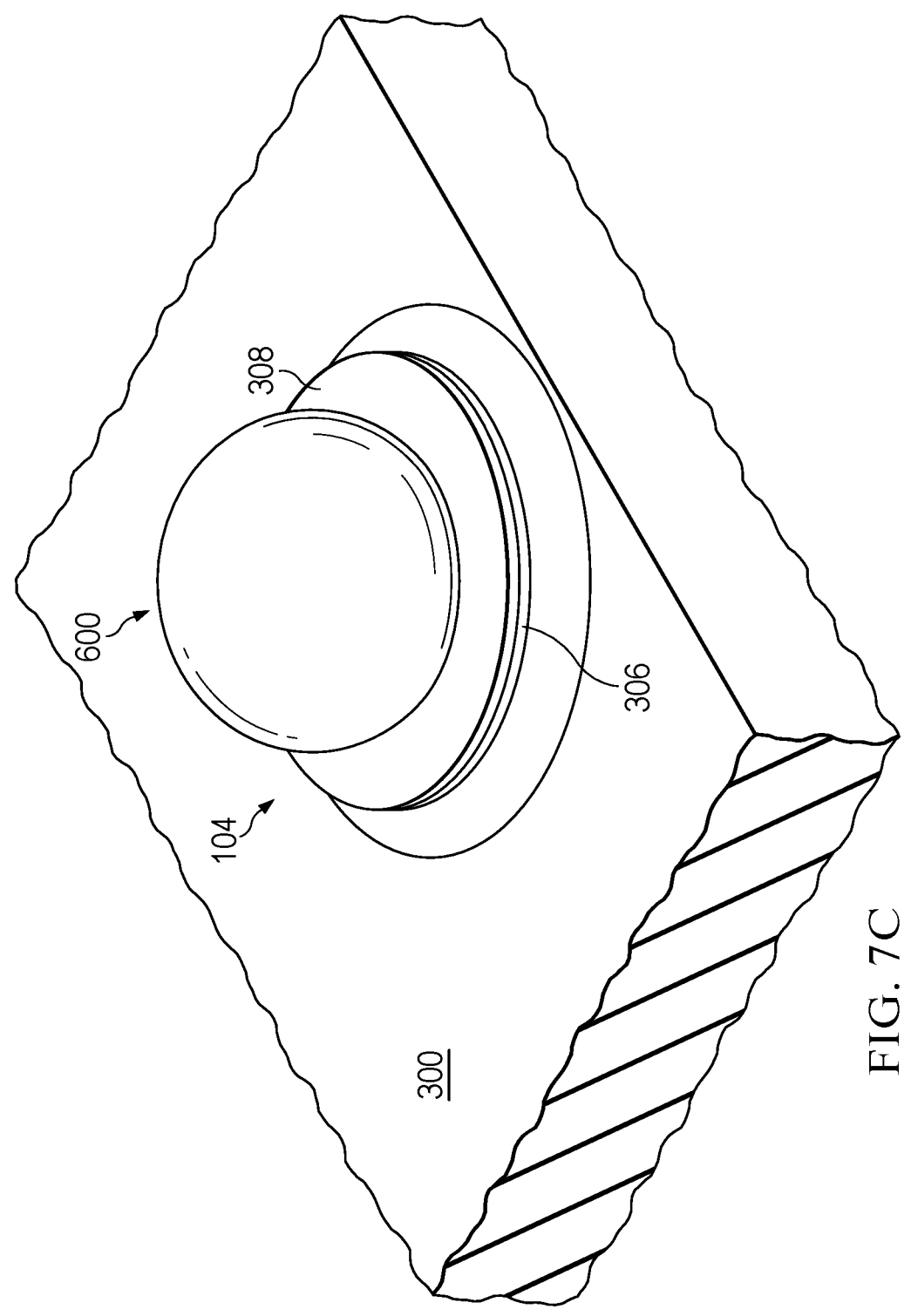
FIG. 7C is a perspective view of a semiconductor package conductive terminal coupled to a conductive member with a metal core to facilitate substrate connections, in accordance with various examples.

FIG. 7A is a cross-sectional profile view of a semiconductor package conductive terminal coupled to a conductive member with a metal core to facilitate substrate connections, in accordance with various examples. More specifically, FIG. 7A shows the conductive member 600 positioned on the flux layer 308 of the conductive terminal 104. A reflow process may be performed to cause the conductive terminal 104 to adhere to the flux layer 308 and to activate the solder layer 606. Such a reflow process includes heating the flux layer 308 and the solder layer 606 to a temperature between 220 degrees Celsius and 250 degrees Celsius for a liquidus time ranging from 30 seconds to 60 seconds, with heat applications outside of these ranges resulting in damage to the flux layer 308 and/or poor adhesion between the solder layer 606 and the flux layer 308, and/or inappropriate activation of the solder layer 606. FIG. 7B is a top-down view of the structure of FIG. 7A, in accordance with various examples. FIG. 7C is a perspective view of the structure of FIG. 7A, in accordance with various examples.

Figure 8A:
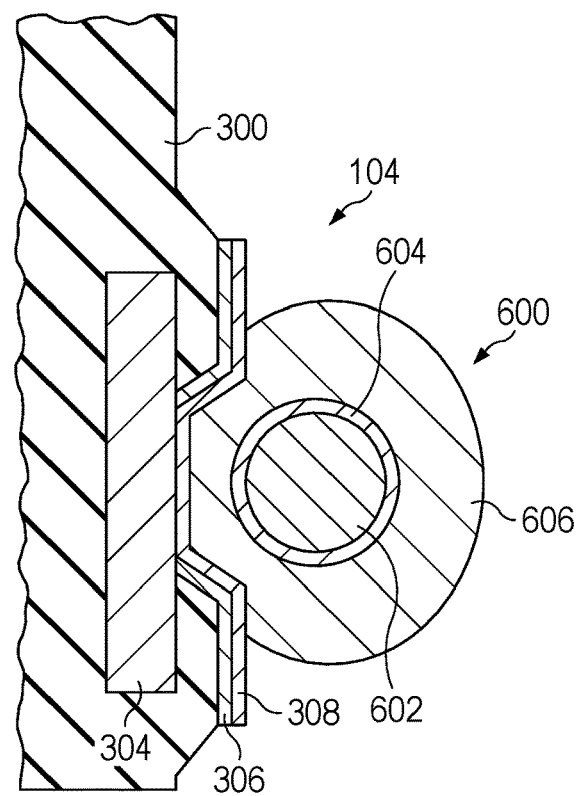
FIG. 8A is a cross-sectional profile view of a semiconductor package coupled to a conductive member with a metal core to facilitate substrate connections, in accordance with various examples.
Figure 8B:
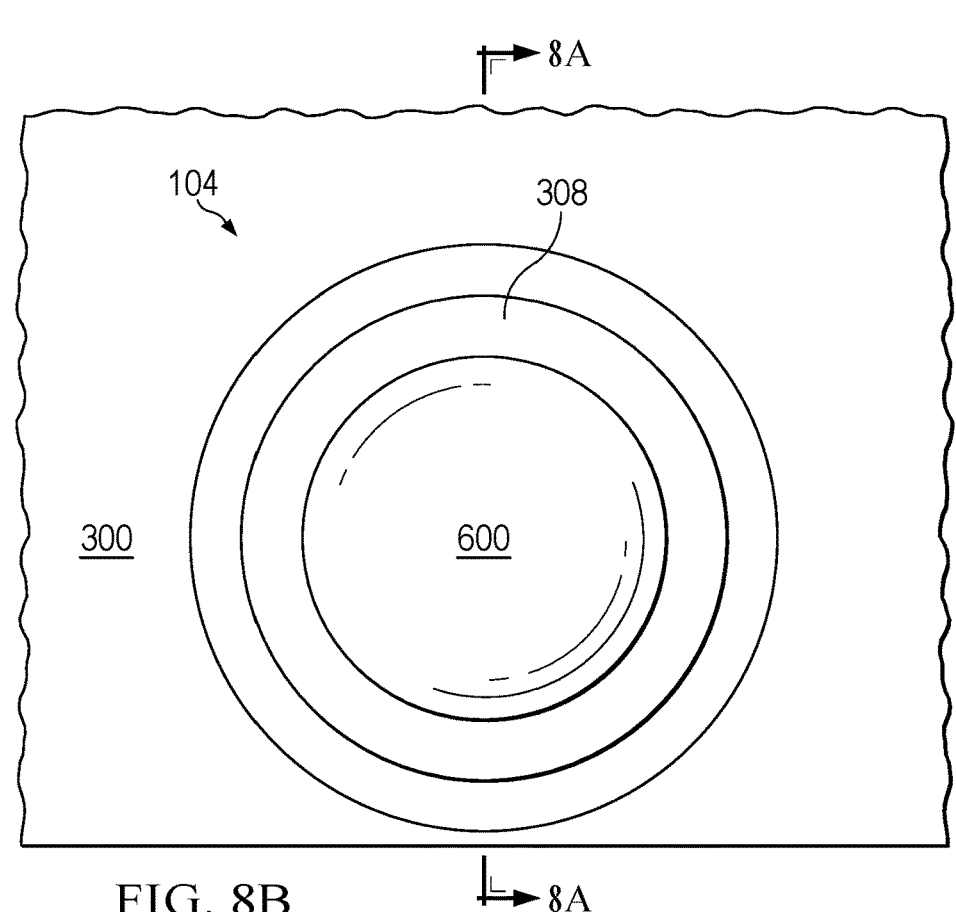
FIG. 8B is a frontal view of a semiconductor package coupled to a conductive member with a metal core to facilitate substrate connections, in accordance with various examples.
Figure 8C:
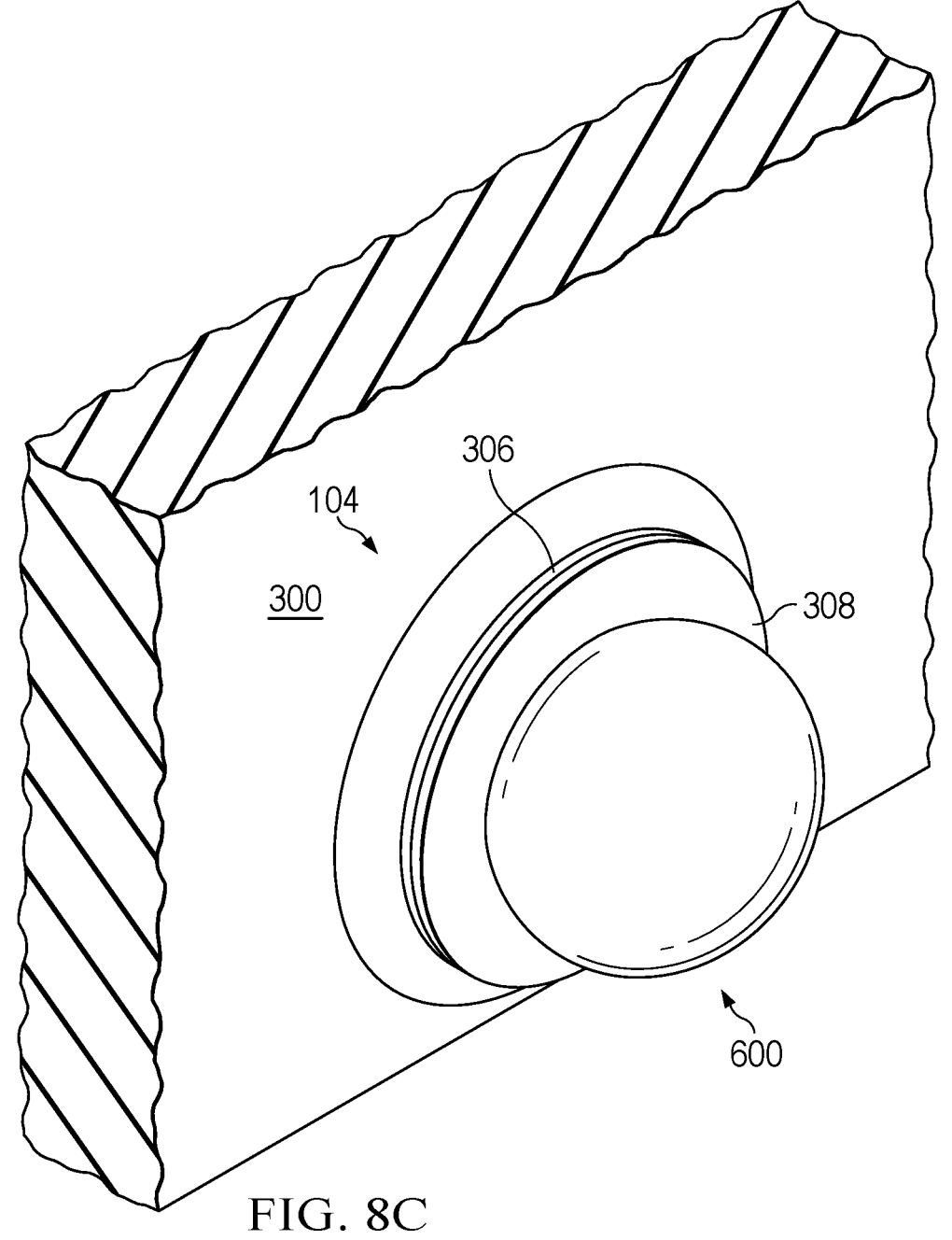
FIG. 8C is a perspective view of a semiconductor package coupled to a conductive member with a metal core to facilitate substrate connections, in accordance with various examples.

FIG. 8A is a cross-sectional profile view of a semiconductor package coupled to a conductive member with a metal core to facilitate substrate connections, in accordance with various examples. More specifically, FIG. 8A shows the structure of FIG. 7A, but rotated 90 degrees to demonstrate the adhesion of the conductive member 600 to the conductive terminal 104. In FIG. 8A, the bottom of the figure is downward toward the earth, and thus in the absence of adhesion of the conductive member 600 to the conductive terminal 104, the conductive member 600 would fall out of place and downward due to gravity. However, because the flux layer 308 adheres to the conductive member 600, the conductive member 600 remains in place. FIG. 8B is a frontal view of the structure of FIG. 8A, in accordance with various examples. FIG. 8C is a perspective view of the structure of FIG. 8A, in accordance with various examples.

Figure 9A:
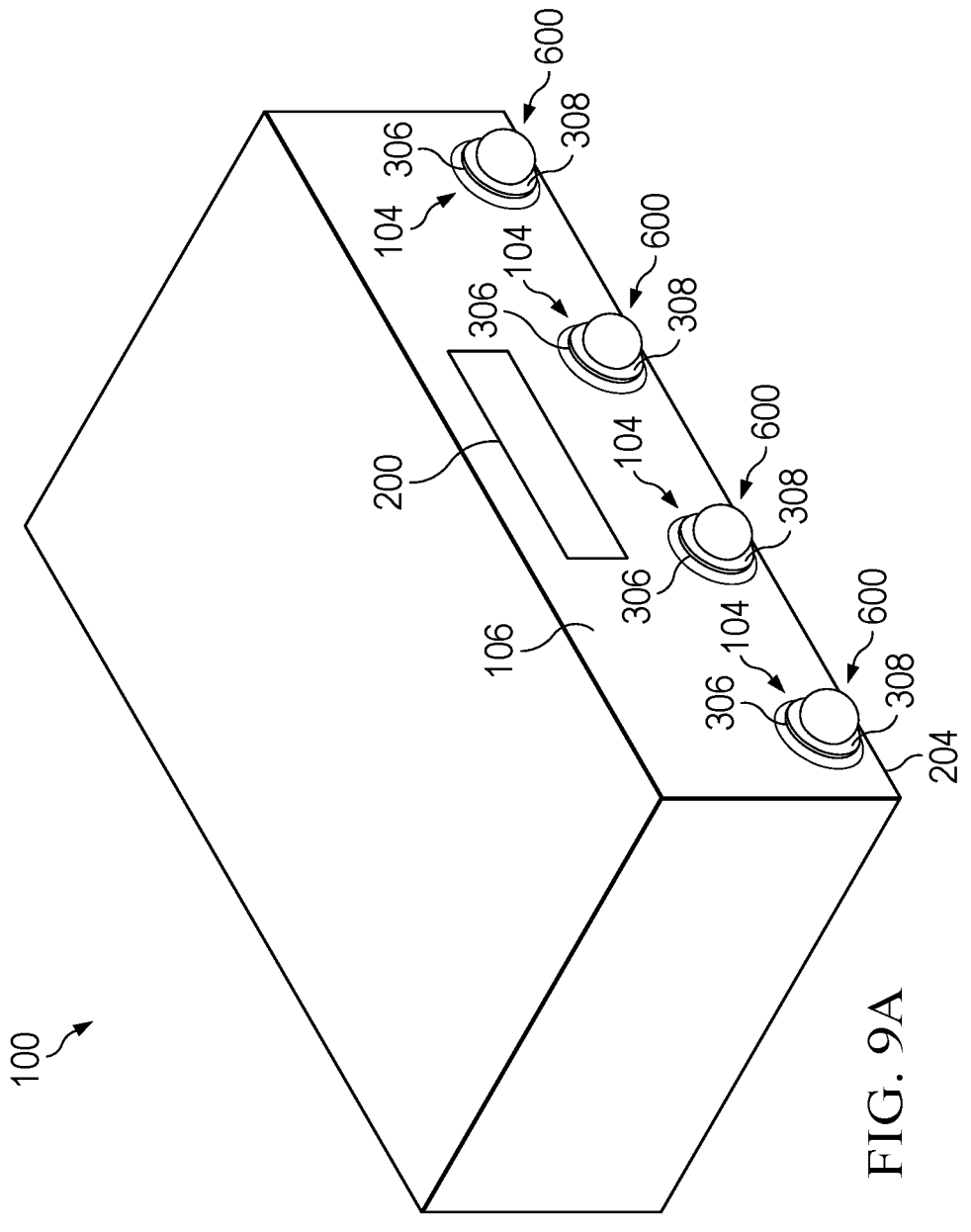
FIG. 9A is a perspective view of a semiconductor package coupled to a conductive member with a metal core to facilitate substrate connections, in accordance with various examples.

FIG. 9A is a perspective, zoomed-out view of FIGS. 8A-8C, meaning the entirety of the semiconductor package 100 (FIG. 2A) is visible, with a different conductive member 600 coupled to each of the conductive terminals 104. FIG. 9B is a frontal view of the structure of FIG. 9A.

Figure 10A:
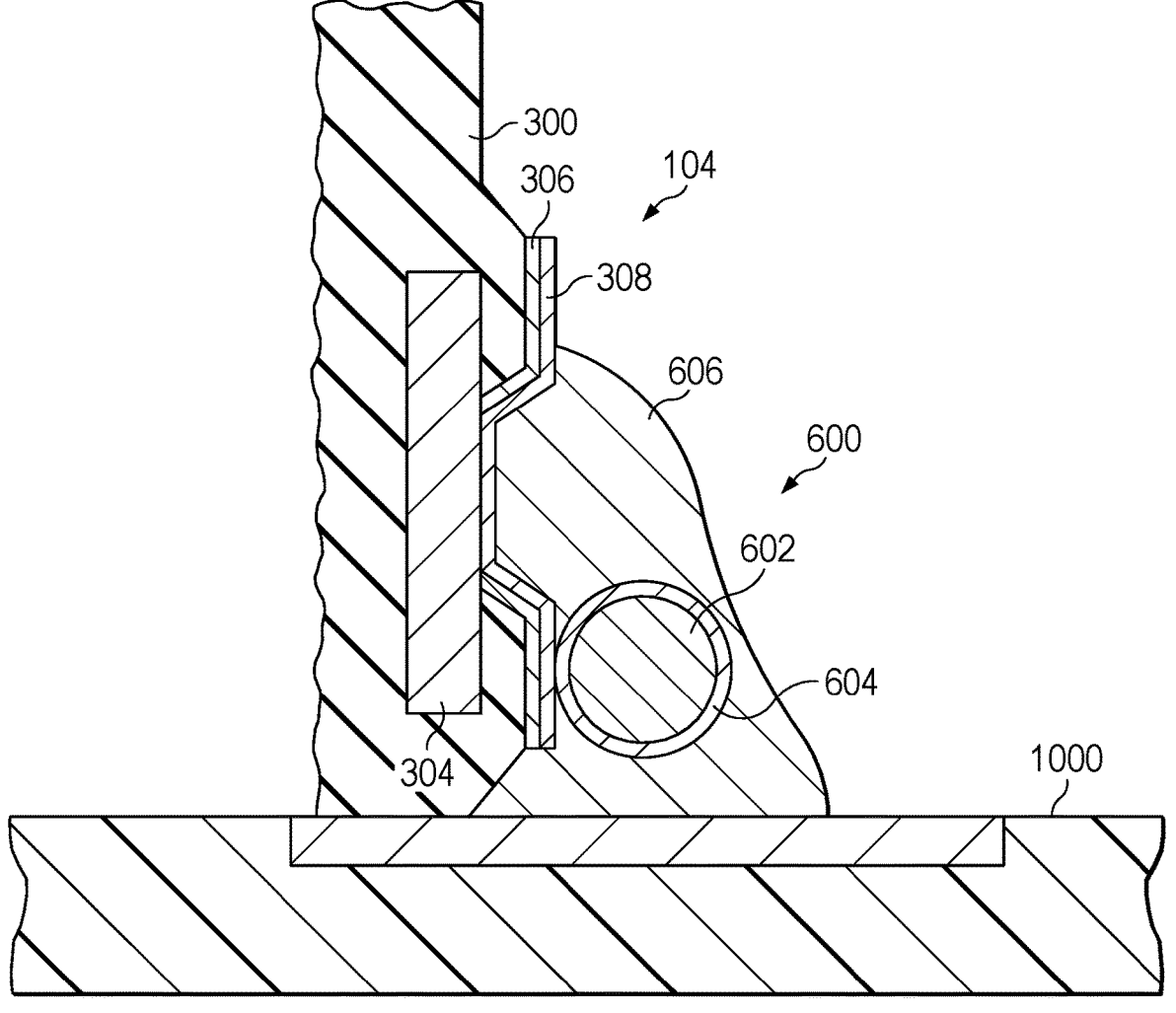
FIG. 10A is a cross-sectional profile view of a semiconductor package coupled to a substrate by way of a conductive member with a metal core, in accordance with various examples.

After the conductive members 600 have been adhered to the flux layers 308 on respective conductive terminals 104, the semiconductor package 100 may be coupled to a PCB by a reflow process. FIG. 10A shows the semiconductor package 100 positioned on a PCB 1000. For example, each of the conductive terminals 104 may be positioned above a different metal trace of the PCB 1000. The metal traces of the PCB 1000 are not expressly shown. The conductive members 600 have been reflowed such that the solder layers 606 have flowed with gravity toward the PCB 1000 and have coupled to the PCB 1000. As the solder layers 606 cool, they solidify and form electrical pathways between the conductive terminals 104 and the PCB 1000.

As described above, various features of the conductive members 600 facilitate solder flow and the establishment of electrical pathways between the conductive terminals 104 and the PCB 1000. The conductive member 600 has a volume ranging from 54 kilomicrons$^3$ to 3600 kilomicrons$^3$, with a greater volume being disadvantageous because it unacceptably raises the risk of unintended electrical connections to nearby solder bumps or balls, and with a lesser volume being disadvantageous because of the unacceptable risk of inadequate connection to the underlying substrate or PCB. As the solder layer 606 is heated during the reflow process, the metal core 602 is permitted to move, and gravity pulls the metal core 602 downward toward the PCB 1000. The weight (or mass) of the metal core 602 as the metal core 602 moves toward the PCB 1000 encourages movement of the solder layer 606 toward the PCB 1000. The diameter of the metal core 602 may similarly encourage solder flow. The diameter of the metal core 602 is between 30 microns and 100 microns, with a larger diameter being disadvantageous because it unacceptably raises the risk of unintended electrical connections to nearby solder bumps or balls, and with a smaller diameter being disadvantageous because of the unacceptable risk of inadequate connection to the underlying substrate or PCB. The shape of the metal core 602 may also affect solder flow. A spherical shape of the metal core 602 facilitates solder flow. A cuboid shape of the metal core 602 restricts solder flow. An ovoid shape of the metal core 602 facilitates solder flow, but to a lesser degree than a spherical shape of the metal core 602. The metal core 602 may be composed of metals such as copper or alloys that contain copper as the primary metal. The protective layer 604 may be composed of metals such as nickel or alloys that contain nickel as the primary metal. In the event that the protective layer 604 becomes exposed to ambient environment due to the pattern of solder flow of the solder layer 606, the protective layer 604 protects the metal core 602 from oxidation and other types of damage. The thickness of the protective layer 604 ranges from 2 microns to 5 microns, with a thicker protective layer 604 being disadvantageous because it would increase complexity of manufacture without providing any benefit, and with a thinner protective layer 604 being disadvantageous because it would not prevent diffusion between the metal core 602 and the solder layer 606. The solder layer 606 has a thickness ranging from 20 microns to 100 microns, with a thicker solder layer 606 being disadvantageous because of the unacceptably increased risk of unintended connections to nearby bumps or balls, and with a thinner solder layer 606 being disadvantageous because of the unacceptable risk of inadequate connection to the underlying substrate or PCB. The volume of the solder layer 606 ranges from 40 kilomicrons$^3$ to 300 kilomicrons$^3$ to achieve adequate connections between the connective terminals 104 and the PCB 1000, with a volume greater than this range being disadvantageous because of inadvertent coupling to nearby electrically conductive components, and with a volume less than this range being disadvantageous because of the risk that the solder layer 606 will not reach the PCB 1000 to form an electrical connection. The volume of the solder layer 606 is a percentage of the conductive member 600 volume ranging from 30% to 60%, with a smaller percentage being disadvantageous because of a lack of adequate solder to form electrical connections to the PCB 1000, and with a percentage larger than this range being disadvantageous because of a lack of current carrying capacity due to the relatively low core volume. The volume of the solder layer 606 depends at least in part on the distance 202 (FIG. 2A) between the conductive terminal 104 (and, more specifically, the bottom-most end of the metal seed layer 306 and/or the flux layer 308) and the edge 204 (FIG. 2A), with a greater distance 202 requiring a larger volume of the solder layer 606, and a lesser distance 202 requiring a smaller volume of the solder layer 606.

Figure 10B:
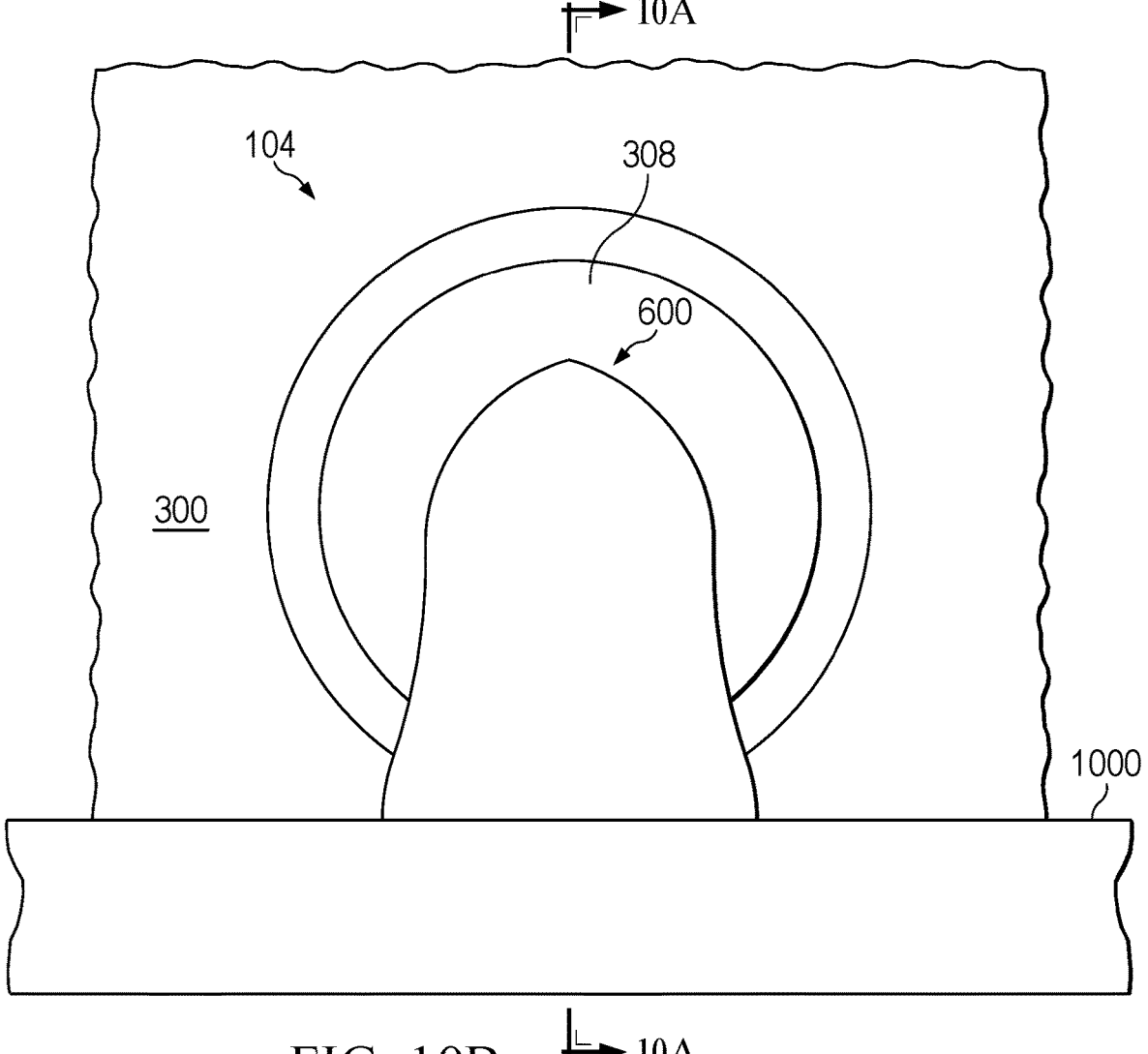
FIG. 10B is a frontal view of a semiconductor package coupled to a substrate by way of a conductive member with a metal core, in accordance with various examples.
Figure 10C:
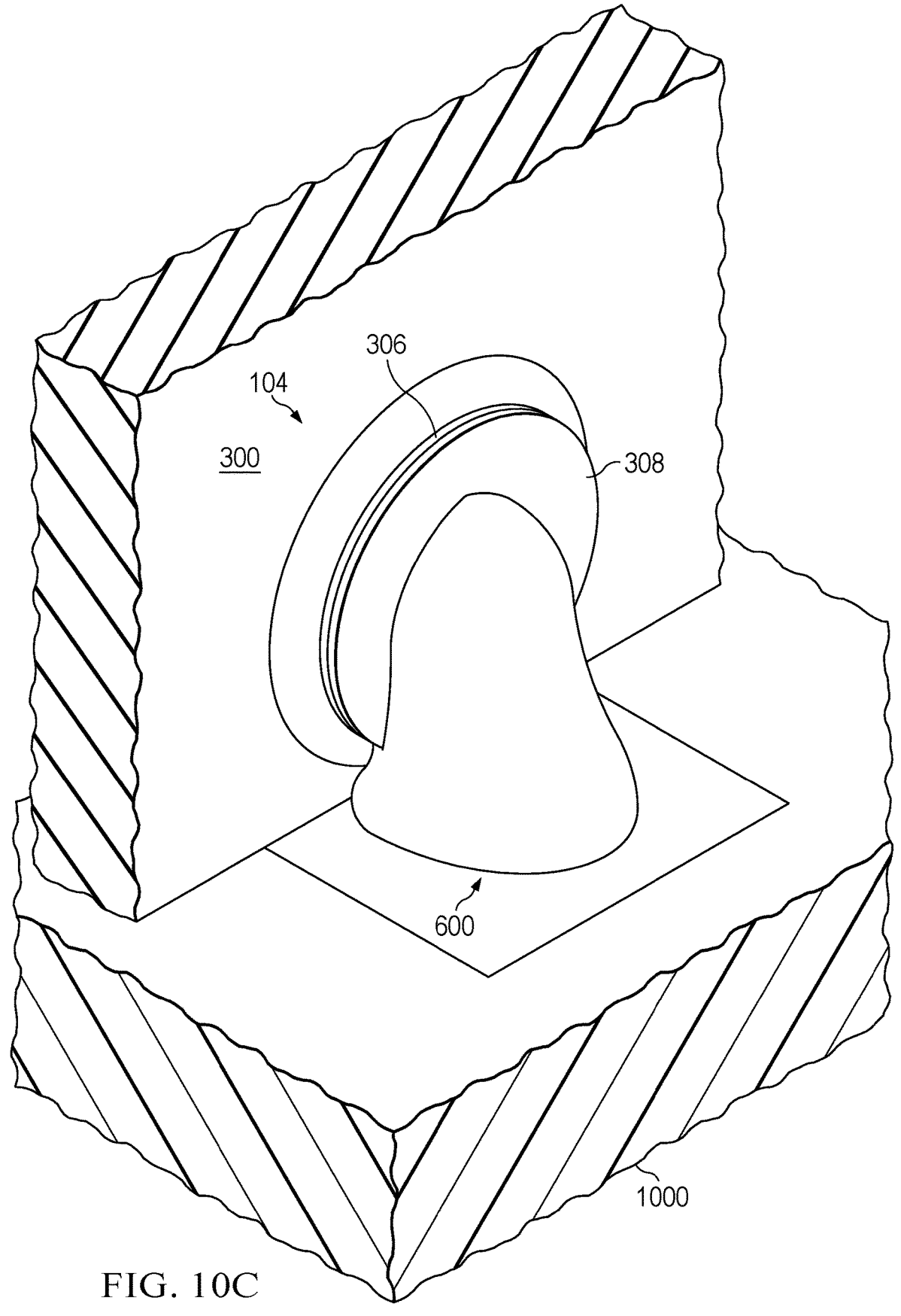
FIG. 10C is a perspective view of a semiconductor package coupled to a substrate by way of a conductive member with a metal core, in accordance with various examples.

FIG. 10B is a frontal view of the structure of FIG. 10A, in accordance with various examples. FIG. 10C is a perspective view of the structure of FIG. 10A, in accordance with various examples.

Figure 11A:
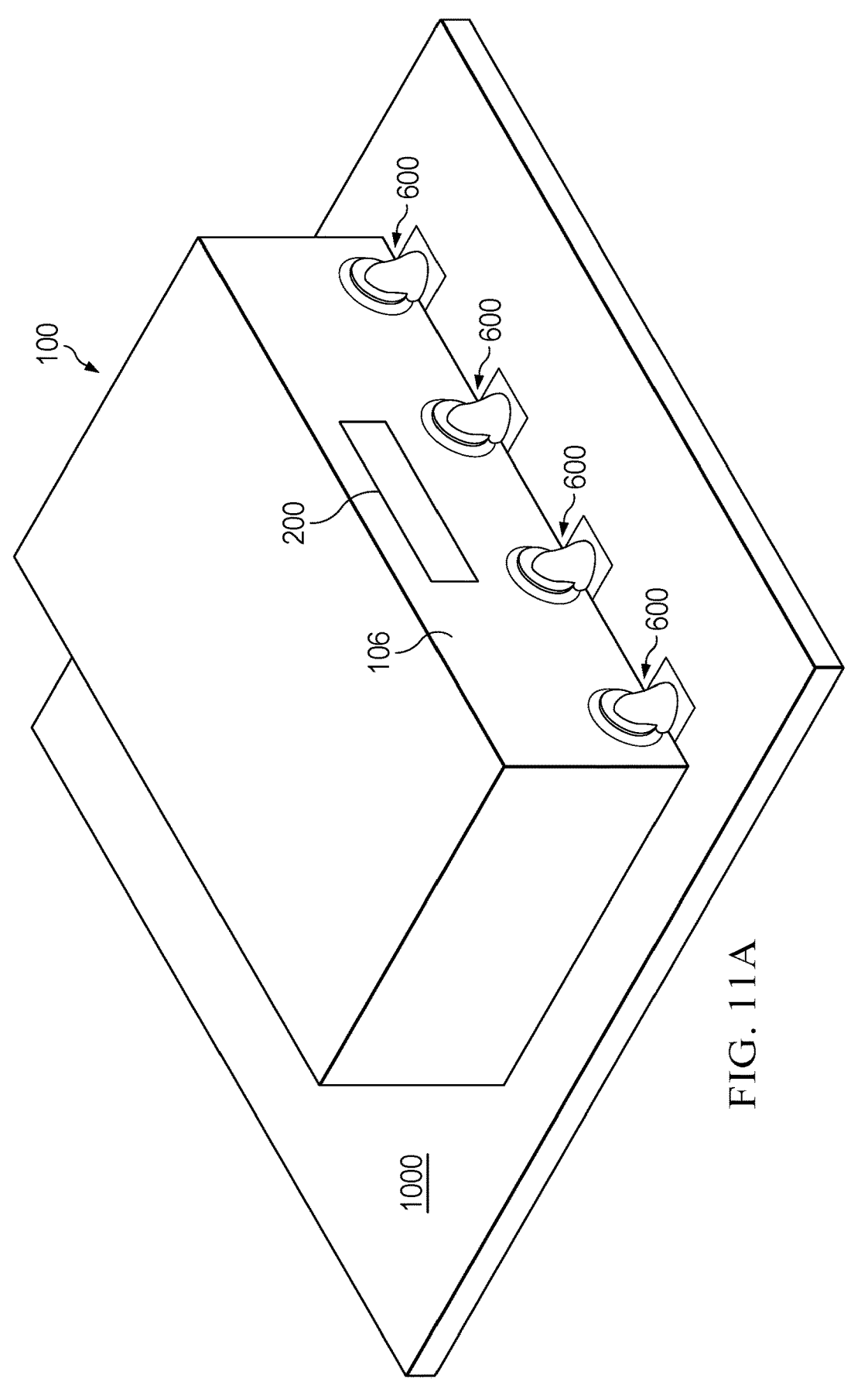
FIG. 11A is a perspective view of a semiconductor package coupled to a substrate by way of a conductive member with a metal core, in accordance with various examples.
Figure 11B:
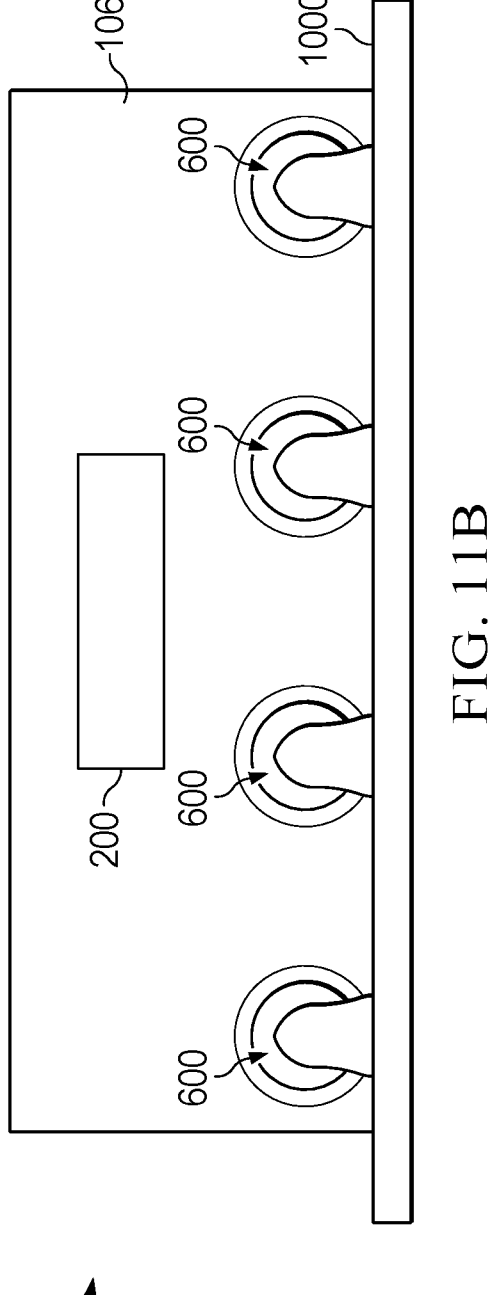
FIG. 11B is a frontal view of a semiconductor package coupled to a substrate by way of a conductive member with a metal core, in accordance with various examples.
Figure 11C:
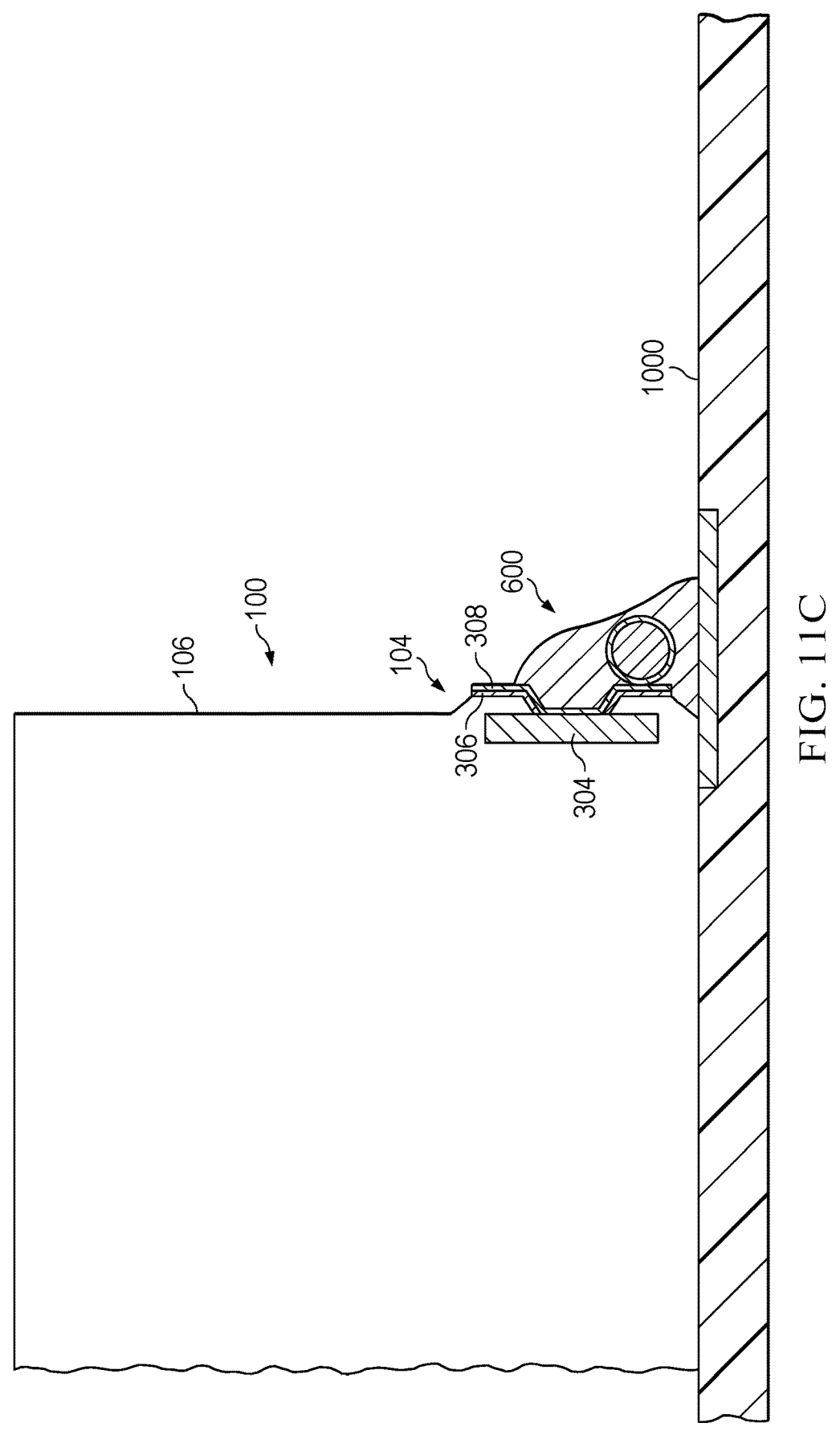
FIG. 11C is a cross-sectional profile view of a semiconductor package coupled to a substrate by way of a conductive member with a metal core, in accordance with various examples.

FIG. 11A is a perspective, zoomed-out view of the structure of FIGS. 10A-10C, showing the entirety of the semiconductor package 100 coupled to the PCB 1000, in accordance with various examples. FIG. 11B is a frontal view of the structure of FIG. 11A, in accordance with various examples. FIG. 11C is a profile cross-sectional view of the structure of FIG. 11A, in accordance with various examples.

FIG. 12 is a flow diagram of a method 1200 for manufacturing a semiconductor package and coupling the package to a substrate by way of a conductive member with a metal core, in accordance with various examples. The method 1200 includes coupling a semiconductor die to a conductive terminal (1202). For example, FIG. 1 shows the semiconductor die 102 coupled to the conductive terminal 104. The method 1200 includes covering the semiconductor die with a housing, where the conductive terminal is exposed to an exterior surface of the housing, and the conductive terminal is located between 20 microns and 100 microns from an edge of the housing (1204). As FIG. 2A shows, the semiconductor die 102 is covered by the walls (e.g., formed of a mold compound) of the semiconductor package 100, the conductive terminal 104 is exposed to the surface 106, and the conductive terminal 104 is located a distance 202 from the edge 204, where the distance 202 falls within the range specified in step 1204.

The method 1200 includes applying a metal layer to the conductive terminal (1206). FIG. 4A shows the application of the metal seed layer 306 to the conductive terminal 104. The method 1200 includes applying a flux layer to the metal layer (1208). FIG. 5A shows the application of the flux layer 308 to the metal seed layer 306. The method 1200 includes positioning a conductive member on the flux layer, where the conductive member includes a metal core and a solder layer covering the metal core (1210). FIG. 7A shows the conductive member 600 positioned on the flux layer 308 and further shows the conductive member 600 including the metal core 602 and the solder layer 606.

The method 1200 includes performing a first reflow process of the solder layer (1212). The method 1200 includes performing a second reflow process of the solder layer to cause the conductive member to reach a plane coincident with the edge and perpendicular to the exterior surface of the housing (1214). FIGS. 10A and 11A show the solder layer 606 flowing due to gravity and reaching a plane coincident with the edge 204 (FIG. 2A), the plane being perpendicular to the surface 106 (FIG. 2A).

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A semiconductor package, comprising:
a semiconductor die including a circuit;
a housing covering the semiconductor die, the housing including a top surface and a side surface;
a conductive terminal coupled to the semiconductor die and exposed to the side surface of the housing;
a sensor exposed on the side surface of the housing;
a flux layer on the conductive terminal; and
a conductive member on the flux layer, the conductive member including:
a copper core;
a nickel layer covering the copper core; and
a solder layer covering the nickel layer.

2. The semiconductor package of claim 1, wherein the conductive terminal includes a bond pad, a protective layer abutting the bond pad, and a metal seed layer abutting the protective layer.

3. The semiconductor package of claim 1, wherein the solder layer has a volume ranging from 40 kilomicrons$^3$ to 300 kilomicrons$^3$.

4. The semiconductor package of claim 1, wherein the nickel layer has a thickness ranging from 2 microns to 5 microns.

5. The semiconductor package of claim 1, wherein the copper core has a spherical or ovoid shape.

6. The semiconductor package of claim 1, wherein the flux layer has a thickness ranging from 20 microns to 40 microns.

7. The semiconductor package of claim 1, wherein the solder layer has a thickness ranging from 20 microns to 100 microns.

8. The semiconductor package of claim 1, wherein the copper core has a diameter between 30 microns and 100 microns.

9. The semiconductor package of claim 1, wherein the conductive terminal is located between 20 microns and 100 microns from an edge of the housing.

10

10. The semiconductor package of claim 1, wherein the conductive member has a volume ranging from 14 kilomicrons$^3$ to 524 kilomicrons$^3$, and the solder layer has a volume that is a percentage of the copper core volume ranging from 40% to 80%.

11. A semiconductor package, comprising:
a semiconductor die including a circuit;
a housing covering the semiconductor die, the housing including a side surface orthogonal to a top surface of the housing;
a conductive terminal coupled to the semiconductor die and exposed to the side surface;
and
a conductive member attached to the conductive terminal, the conductive member including:
a copper core;
a nickel layer covering the copper core; and
a solder layer covering the nickel layer.

12. The semiconductor package of claim 11, wherein the copper core has a diameter ranging from 30 microns to 100 microns.

13. The semiconductor package of claim 11, wherein the solder layer has a volume ranging from 40 kilomicrons$^3$ to 300 kilomicrons$^3$.

14. The semiconductor package of claim 11, wherein the flux layer has a thickness ranging from 20 microns to 40 microns.

15. The semiconductor package of claim 11, wherein the solder layer has a thickness ranging from 20 microns to 100 microns.

16. The semiconductor package of claim 11, wherein the conductive member includes a spherical or an ovoid shape.

17. A semiconductor package, comprising:
a semiconductor die electrically coupled to a conductive terminal, and to an optical sensor;
a housing in contact with the semiconductor die and the conductive terminal, the housing including a top surface and a side surface orthogonal to the top surface, the optical sensor visible from the side surface of the housing; and
a conductive member attached to the conductive terminal, the conductive member including:
a copper core;
a nickel layer in contact with the copper core; and
a solder layer in contact with the nickel layer, wherein the conductive member is on the side surface of the housing.

18. The semiconductor package of claim 17, wherein the conductive member includes a spherical or an ovoid shape.

19. The semiconductor package of claim 17, wherein the conductive member is proximate a bottom surface of the housing than the top surface, the bottom surface opposite the top surface.

* * * * *